(12) United States Patent
Matsuda et al.

(10) Patent No.: US 7,864,412 B2
(45) Date of Patent: Jan. 4, 2011

(54) SEMICONDUCTOR OPTICAL AMPLIFIER DEVICE AMPLIFYING EXTERNAL LIGHT SIGNAL AND DRIVING APPARATUS THEREFOR

(75) Inventors: Kyoko Matsuda, Nara (JP); Toshiyuki Okumura, Tenri (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 267 days.

(21) Appl. No.: 12/018,034

(22) Filed: Jan. 22, 2008

(65) Prior Publication Data

US 2008/0174856 A1 Jul. 24, 2008

(30) Foreign Application Priority Data

Jan. 23, 2007 (JP) ............................. 2007-012401

(51) Int. Cl.
*H01S 5/00* (2006.01)
*H04B 10/12* (2006.01)
(52) U.S. Cl. .................. 359/344; 359/336; 372/45.013
(58) Field of Classification Search ................. 359/344, 359/336; 372/45.013
See application file for complete search history.

(56) References Cited

U.S. PATENT DOCUMENTS

| 3,828,231 | A * | 8/1974 | Yamamoto ................... 359/344 |
| 2004/0091009 | A1 | 5/2004 | Matsuda et al. | |
| 2006/0049336 | A1 | 3/2006 | Matsuda et al. | |
| 2008/0159751 | A1 * | 7/2008 | Matsui et al. ................ 398/183 |

FOREIGN PATENT DOCUMENTS

| JP | 02-137383 | A | 5/1990 |
| JP | 9-171202 | A | 6/1997 |
| JP | 09-275224 | A | 10/1997 |
| JP | 2004-214407 | A | 7/2004 |
| JP | 2004-214603 | A | 7/2004 |
| JP | 2006-073874 | A | 3/2006 |
| JP | 2007-048905 | A | 2/2007 |

OTHER PUBLICATIONS

Tsurusawa et al. "New method for reduction of carrier lifetime in semiconductor optical amplifier using assist light", Japanese Journal of Applied Physics, vol. 38, pp. 1265-1268 Part 1 No. 2B (Feb. 1999).*

Munroe et al.,"Spectral Broadening of Stochastic Light Intensity-Smoothed by a Saturated Semiconductor Optical Amplifier", IEEE Journal of Quantum Electronics vol. 34, No. 3, pp. 548-551 (Mar. 1998).*

* cited by examiner

*Primary Examiner*—Eric Bolda
(74) *Attorney, Agent, or Firm*—Birch, Stewart, Kolasch & Birch, LLP

(57) ABSTRACT

An active layer has a quantum well structure formed of InGaAsP, and includes a saturable absorption region and optical amplification regions. To the saturable absorption region, a voltage is applied through a p-electrode, independent from the optical amplification region. To the optical amplification regions, currents are injected through p-electrodes, respectively. An input light Pin entering through a plane of incidence is generated by adding optical noise of white noise, to a light signal assuming binary optical intensity of "1" or "0". The saturable absorption region and optical amplification regions are formed satisfying conditions that a waveform converting element provides a semiconductor laser of bistable state.

29 Claims, 13 Drawing Sheets

SEMICONDUCTOR OPTICAL AMPLIFIER DEVICE AMPLIFYING EXTERNAL LIGHT SIGNAL AND DRIVING APPARATUS THEREFOR

This nonprovisional application is based on Japanese Patent Application No. 2007-012401 filed with the Japan Patent Office on Jan. 23, 2007, the entire contents of which are hereby incorporated by reference.

BACKGROUND OF THE INVENTION

1. Field of the Invention

The present invention relates to a semiconductor optical amplifier device and to a semiconductor optical amplifier driving apparatus. More specifically, the present invention relates to a semiconductor optical amplifier device amplifying an external light signal and to a driving apparatus therefor.

2. Description of the Background Art

Along with penetration of large capacity communication, all-optic processing, in which light signals are processed as they are at high speed without converting to electricity, has been promoted. One of the most important tasks to be accomplished regarding the light signals is to increase speed while maintaining signal quality.

In current optical communication systems, a light signal obtained by intensity-modulation of an output light of semiconductor laser is transmitted through an optical fiber. The light signal is reflected time and again at the inner wall of the fiber as it proceeds through the fiber and, at every reflection, the signal intensity lowers because of absorption loss and scattering loss. As a result, the light signal waveform deforms, signal-to-noise ratio (hereinafter denoted as S/N ratio) indicating signal quality lowers, and signal transmission quality degrades.

Various factors deteriorate the light signal as it passes through the optical fiber and through many devices such as repeaters and switches. Influence of waveform deterioration and degradation of the light signal experienced on the route grows as the signal speed increases. Degradation of light signal is a serious cause of increased bit error rate (BER) and it significantly lowers signal quality.

Therefore, it is important for an optical communication device, which processes repetitive pulse light signals of ultra-high speed essential to large capacity optical communication, to have good response characteristic and to curb attenuation along the transmission path.

A high-frequency signal is much affected by "pattern effect" that degrades response characteristic, and hence, it is a significant factor determining signal quality. Dependent on whether a pulse exists at a signal position or not, density of injection carriers remaining in an active layer of a laser device varies at the next signal position, and the pattern effect occurs due to this variation of injection carrier density. Whether there is a pulse at a signal position or not corresponds to "1" and "0" of a binary signal.

With the carrier life of electrons being several ns, a high-frequency signal of which period is comparable to or longer than the carrier life would be influenced if the preceding signal is "1", as the residual carriers exist at the next signal position. Particularly, when the semiconductor laser is provided with a saturable absorption region, the influence of residual carriers increases, as the carrier life is long in the saturable absorption region. Because of the pattern effect as such, signal waveform may be lost as the bias is effectively applied at the next signal timing or the fall of the signal trails so long as to overlap the next signal. In that case, even at the position of a signal "0", the light is not off and, hence, coefficient of extinction degrades.

In view of the foregoing, a receiver having good response characteristic capable of preventing increase in bit error rate and detecting a deteriorated weak signal has been developed.

At present, a photodiode (PD) using an InGaAs-based semiconductor material for long wavelength range has been widely used in receivers for optical communication. By enlarging light receiving area of the photodiode, sensitivity of the receiver can be improved. When the light receiving area of the photodiode is increased, however, speed of response lowers. Therefore, it is difficult to use the photodiode for large-capacity and ultra-high-speed future optical communication.

Recently, a new photodiode called Uni-Traveling-Carrier Photodiode (UTC-PD) has been proposed, in Japanese Patent Laying-Open No. 09-275224. In a common photodiode, carriers that travel include both holes and electrons. The holes travel slow, and prevent fast response. Therefore, in the UTC-PD, holes are not used and only the electrons that travel fast are used, to enable high-speed response of several hundreds GHz or higher.

As is naturally understood from the principle of UTC-PD that fast response and high output property are realized by using only the electrons as traveling carriers, the performance of sensing weak signals is substantially the same as that of the conventional photodiode. Therefore, UTC-PD is not suitable for detecting a light signal deteriorated by transmission loss.

Technique for solving transmission loss by amplifying and waveform-shaping a deteriorated light signal has been developed. As an example, reproduction of light signal utilizing bistable semiconductor laser having a saturable absorption region will be described with reference to the figures.

FIG. 14 is a graph showing injection light-optical output characteristic curve of a general bistable semiconductor laser having saturable absorption region. FIG. 15(a)-15(c) illustrate operational characteristics of a conventional light signal reproducing apparatus using the bistable semiconductor laser having a saturable absorption region.

FIG. 15(a) represents the injection light-optical output characteristic curve of the bistable semiconductor laser shown in FIG. 14; FIG. 15(b) represents a light signal PIN injected to the bistable semiconductor laser having the characteristic of FIG. 15(a); and FIG. 15(c) represents output light Pout obtained by injecting the light signal PIN of FIG. 15(b) to the bistable semiconductor laser having the characteristic of FIG. 15(a).

When a light signal that is modulated between an optical intensity below a threshold value Pth2 and an optical intensity above an oscillation threshold value Pth1 is injected as shown in FIG. 15(b) to the bistable semiconductor laser having the injection light-optical output characteristic as shown in FIG. 15(a), an amplified optical output can be obtained from the bistable semiconductor laser as shown in FIG. 15(c). Thus, effects of improved S/N (Signal to Noise) ratio and waveform shaping can be attained.

The bistable semiconductor laser as described above is capable of amplifying and detecting a weak light signal of the level around oscillation threshold value. The performance, however, is limited as the light signal cannot be detected unless the intensity of injected light goes up or down across the threshold value. Therefore, it cannot be used for a light signal having small amplitude or attenuated below the threshold.

Japanese Patent Laying-Open No. 2004-214407 discloses, as another example that can compensate for the transmission loss, a stochastic resonance apparatus performing amplification and waveform shaping of an input signal. For the stochastic resonance apparatus requiring non-linear input-output characteristic, a bistable semiconductor laser 112 of FIG. 16, for example, having non-linear characteristic, is used.

FIG. 16 is a cross-sectional view showing a structure of a general bistable semiconductor laser 112 used as the stochastic resonance apparatus.

Referring to FIG. 16, bistable semiconductor laser 112 includes: an active layer 120 including an optical amplifying region 121 and a saturablel absorption region 122; p-type electrodes 123 and 124; a p-type clad layer 125; an n-type clad layer 126; and an n-type electrode 127. On the n-type electrode 127, n-type clad layer 126 is provided. On the n-type clad layer 126, active layer 120 is provided. On active layer 120, p-type clad layer 125 is provided. On p-type clad layer 125, p-type electrodes 123 and 124 are provided.

Bistable semiconductor laser 112 receives input light PIN from optical amplification region 121 and outputs output light POUT from saturable absorption region 122. The stochastic resonance apparatus such as shown in FIG. 16 inputs a signal, obtained by adding noise to a signal that has been deteriorated along the transmission path to be too weak to exceed hysteresis threshold value of the bistable semiconductor laser, to the bistable semiconductor laser. At this time, the output signal goes up/down across the hysteresis corresponding to the peak of the input signal and, therefore, an output signal of which waveform is well shaped and intensity amplified to emphasize the input signal period can be obtained.

By the above-described effect of stochastic resonance, it becomes possible to detect, amplify or shape the waveform of such a weak signal that cannot be detected by a common functional element.

Japanese Patent Laying-Open No. 02-137383 discloses, as another example that can obtain a signal with magnified amplitude, a driving method in which current is injected to the saturable absorption region in the semiconductor laser device in a bistable state to apply a bias voltage in the forward direction (hereinafter referred to as forward bias voltage).

FIG. 17 is a cross-sectional view showing a schematic device structure of a conventional semiconductor laser device 160 of the bistable state.

Referring to FIG. 17, semiconductor laser device 160 includes an optical amplification region 161, a saturable absorption region 162, and an active layer 163. Semiconductor laser device 160 is formed as an AlGaAs/GaAs lateral mode control type semiconductor laser device formed on a GaAs substrate. As shown in FIG. 17, in semiconductor laser device 160, electrode on one side of the device is divided, and in active layer 163, photo amplifying region 161 and saturable absorption region 162 are provided.

In semiconductor laser device 160, a current Ih injected to optical amplification region 161 is set to an intermediate value of oscillation threshold values corresponding to voltages VA and VB. Semiconductor laser device 160 receives at saturable absorption region 162 a signal voltage Vh with the forward bias voltage alternately changing to VA and VB, and outputs output light POUT from active layer 163. Semiconductor laser device 160 has the characteristic of bistable state as described with reference to FIG. 14.

The shape of hysteresis shown in FIG. 14 varies in accordance with current injection or voltage application to saturable absorption region 162. When a current is injected or forward bias voltage is applied to saturable absorption region 162, carrier concentration increases and, hence, the effect of light absorption decreases. Thus, hysteresis as a whole moves to the side of lower value of injection current, and the value of rising threshold Pth1 lowers. Therefore, in semiconductor laser device 160, the oscillation threshold value can be changed by increasing/decreasing the light absorption effect of saturable absorption region 162.

FIG. 18 illustrates an operation of semiconductor laser device 160 in the bistable state shown in FIG. 17.

Semiconductor laser device 160 includes saturable absorption region 162 that constitutes a loss to the oscillation light in active layer 163. Therefore, when current is injected only to the optical amplification region 116, optical output increases non-linearly at a certain current value, as shown in FIG. 18. Specifically, when the forward bias voltage applied to saturable absorption region 162 increases from VA to VB (VA<VB), carriers in saturable absorption region 162 increases and optical loss decreases accordingly. As a result, the current value (rising threshold value) at which the optical output increases lowers from IhA to IhB.

Therefore, by applying forward bias signal voltage Vh, of which voltage changes from VA to VB, to saturable absorption region 162 while a constant bias current Ih (IhB<Ih<IhA) is injected to optical amplification region 161, the rising threshold comes to fluctuate between IhA and IhB, whereby a modulated output light Pout can be obtained.

With the detection sensitivity of a conventional photodiode, it is impossible to detect a weak signal that has been attenuated due to the loss along the transmission path of ultra-high-speed communication.

Though a light signal receiving apparatus using a histable semiconductor laser can amplify a weak light signal around oscillation threshold value, its performance is limited that the light signal cannot be amplified unless the intensity of the injection light goes up/down across the threshold value. Therefore, optical amplification by the bistable semiconductor laser is not effective on a signal having small amplitude or a signal of which intensity is attenuated below the threshold value.

The stochastic resonance apparatus in accordance with Japanese Patent Laying-Open No. 2004-214407 provides a high-speed output signal having amplified intensity and well-shaped waveform emphasizing the period of the input signal, by using a bistable semiconductor laser exhibiting hysteresis in the input-output characteristic. In such a stochastic resonance apparatus, it is important to optimally determine and control the shape of hysteresis in accordance with the input signal, while sufficient description in this connection cannot be found in Japanese Patent Laying-Open No. 2004-214407.

According to the method of driving with forward bias voltage of bistable semiconductor laser described in Japanese Patent Laying-Open No. 02-137383, the light signal can be amplified by a simple driving method. In the saturable absorption region having light absorbing effect, however, a depletion layer serves as a junction capacitance, and dominates the speed of response based on CR time constant. Therefore, driven with forward bias voltage, the speed of response becomes slower. As a result, pattern effect tends to be induced, resulting in unsatisfactory reproduction of the signal.

SUMMARY OF THE INVENTION

An object of the present invention is to provide a semiconductor optical amplifier device and a driving apparatus therefor, capable of receiving a light signal subjected to transmission loss, realizing high-speed response, amplifying the light signal and decreasing bit error rate.

The present invention provides a semiconductor optical amplifier device having discontinuous input-output characteristic for input light and output light, including: an active layer including an optical amplification region and a saturable absorption region; an electrode of a first polarity injecting a current and/or applying voltage to the active layer; and an electrode of a second polarity provided corresponding to the electrode of the first polarity. A first bias voltage is applied to the saturable absorption region such that a rising threshold value of the input-output characteristic lowers at a timing when the input light assumes "1" and a second bias voltage is applied to the saturable absorption region such that a falling threshold value of the input-output characteristic rises at a timing when the input light assumes "0", through the electrodes of first and second polarities.

Preferably, carriers remaining in the saturable absorption region are drawn out as a reverse bias is applied as the second bias voltage.

Preferably, intensity of the voltage applied to the saturable absorption region is adjusted such that amplitude of the output light increases and bit error rate of a light signal is reduced.

Preferably, intensity of the current injected to the optical amplification region is adjusted such that amplitude of the output light increases and bit error rate of a light signal is reduced.

Preferably, the input light is generated by adding an optical noise to a light signal of RZ code system.

Preferably, the optical noise is injected to at least one of the optical amplification region and the saturable absorption region; and intensity of the optical noise is adjusted such that amplitude of the output light increases and bit error rate of the light signal is reduced.

Preferably, difference between maximum and minimum values of the optical noise is at most $1/10$ of the amplitude of the light signal.

Preferably, the optical noise has random intensity.

Preferably, a noise current is injected to at least one of the optical amplification region and the saturable absorption region through the electrodes of first and second polarities, and intensity of the noise current is adjusted such that amplitude of the output light increases and bit error rate of the light signal is reduced.

Preferably, difference between maximum and minimum values of the noise current is at most $1/10$ of the amplitude of the injected current.

Preferably, the noise current has random intensity.

Preferably, the active layer has a quantum well structure.

Preferably, at least one of the electrodes of first and second polarities is divided such that a current can be injected independently to the optical amplification region and the saturable absorption region.

Preferably, an impurity is added to at least one of the optical amplification region and the saturable absorption region, and concentration of the impurity is adjusted such that amplitude of the output light increases and bit error rate of the light signal is reduced.

Preferably, the semiconductor optical amplifier device is a bistable semiconductor laser having an input-output characteristic with hysteresis.

Preferably, the optical amplification region includes first and second optical amplification regions arranged on opposite sides of the saturable absorption region, the light signal enters from an end surface of one of the first and second optical amplification regions, and the output light is emitted from an end surface of the other one of the first and second optical amplification regions.

Preferably, ratio of the length occupied by the saturable absorption region in resonator direction is at least 1% and at most 50%.

According to another aspect, the present invention provides an apparatus for driving a semiconductor optical amplifier device having discontinuous input-output characteristic for input light and output light, including: a semiconductor optical amplification module including the semiconductor optical amplifier device and a photo-electric converting element detecting the output light and outputting a reception signal; and a feedback control circuit receiving the reception signal and outputting a control signal for adjusting input-output characteristic of the semiconductor optical amplifier device. The semiconductor optical amplifier device includes an active layer including an optical amplification region and a saturable absorption region, an electrode of a first polarity injecting a current and/or applying voltage to the active layer, and an electrode of a second polarity provided corresponding to the electrode of first polarity. A first bias voltage is applied to the saturable absorption region such that a rising threshold value of the input-output characteristic lowers at a timing when the input light assumes "1" and a second bias voltage is applied to the saturable absorption region such that a falling threshold value of the input-output characteristic rises at a timing when the input light assumes "0".

Preferably, the apparatus further includes a temperature control circuit controlling temperature of the semiconductor optical amplifier device in accordance with a control signal from the feedback control circuit, and the semiconductor optical amplification module further includes a temperature control mechanism receiving a control signal from the temperature control circuit and adjusting temperature of the semiconductor optical amplification module including the semiconductor optical amplifier device.

Preferably, the temperature control mechanism has a thermistor detecting temperature of the semiconductor optical amplifier device and outputting the temperature detection signal to the feedback control circuit.

Preferably, the temperature control mechanism has a Peltier cooler receiving a control signal from the temperature control circuit and heating or cooling the semiconductor optical amplifier device.

Preferably, the apparatus further includes a variable resistance connected to the semiconductor optical amplifier device, and a variable resistance control unit for controlling resistance value of the variable resistance in accordance with a control signal from the feedback control circuit.

Preferably, the feedback control circuit monitors a current flowing from the saturable absorption region of the semiconductor optical amplifier device through the variable resistance.

Preferably, the apparatus further includes a stochastic resonance control circuit receiving the reception signal and outputting a control signal for supplying a current having a noise added to attain stochastic resonance effect to the semiconductor optical amplifier device; and a current supplying unit receiving the control signal from the stochastic resonance control circuit for supplying a current for adjusting input-output characteristic of the semiconductor optical amplifier device to the semiconductor optical amplifier device.

Preferably, the apparatus further includes a light source for supplying light for adjusting input-output characteristic of the semiconductor optical amplifier device to the semiconductor optical amplifier device.

Preferably, the light source receives the reception signal and supplies light having noise added to attain stochastic resonance effect to the semiconductor optical amplifier device.

Preferably, the apparatus further includes: a voltage control circuit controlling a voltage applied to the saturable absorption region of the semiconductor optical amplifier device based on the control signal from the feedback control circuit, and a voltage supplying unit supplying a voltage adjusted such that the input light goes up/down across rising threshold value and falling threshold value of the semiconductor optical amplifier device, to the semiconductor optical amplifier device, in accordance with a control signal from the voltage control circuit.

Preferably, the apparatus further includes a current supplying unit for supplying a current adjusted such that the input light goes up/down across rising threshold value and falling threshold value of the semiconductor optical amplifier device, to the semiconductor optical amplifier device, based on the reception signal.

Preferably, the photo-electric converting element is integrated on one same substrate as the semiconductor optical amplification module.

According to the present invention, a light signal subjected to transmission loss can be received, high-speed response is realized, the light signal can be amplified and bit error rate can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15(b) shows a light signal PIN injected to the bistable semiconductor laser having the characteristic of FIG. 15(a).

FIG. 15(c) shows an output light Pout obtained by injecting the light signal PIN of FIG. 15(b) to the bistable semiconductor laser having the characteristic of FIG. 15(a).

DESCRIPTION OF THE PREFERRED EMBODIMENTS

Figure 1:
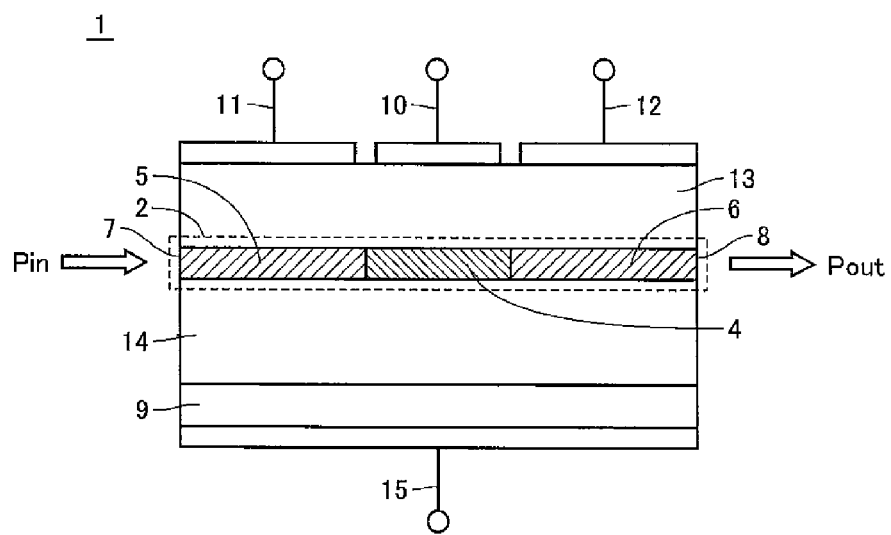
FIG. 1 is a cross-sectional view showing a schematic structure on a resonator side of a semiconductor optical amplifier device 1 in accordance with Embodiment 1 of the present invention.

In the following, embodiments of the present invention will be described in detail with reference to the figures. Throughout the figures, the same or corresponding portions will be denoted by the same reference characters and description thereof will not be repeated.

Embodiment 1

FIG. 1 is a cross-sectional view showing a schematic structure on a resonator side of a semiconductor optical amplifier device 1 in accordance with Embodiment 1 of the present invention.

Referring to FIG. 1, semiconductor optical amplifier device 1 in accordance with Embodiment 1 includes an active layer 2, an n-type InP (indium phosphide) substrate 9, a p-type InP clad layer 13, an n-type InP clad layer 14, p-electrodes 10 to 12, and an n-electrode 15. On n-type InP substrate 9, n-electrode 15 is provided and, on the opposite side, n-type InP clad layer 14 is formed. On n-type InP clad layer 14, active layer 2 is formed.

Active layer 2 has a quantum well structure formed on InGaAsP (indium gallium arsenide), and includes a saturable absorption region 4 and optical amplification regions 5 and 6. Here, the quantum well structure refers to a structure formed by stacking a plurality of semiconductor thin films to limit motion of electrons and holes in the depth direction. The quantum well structure of saturable absorption region 4 and optical amplification regions 5 and 6 of FIG. 1 is identical in composition and thickness of InGaAs. When viewed from the resonator side of semiconductor optical amplifier device 1, optical amplification regions 5 and 6 are provided on opposite sides of saturable absorption region 4. Optical amplification region 5 has a plane of incidence 7 to which the input light Pin enters. Optical amplification region 6 has an emission plane 8 from which output light Pout is emitted.

On active layer 2, p-type InP clad layer 13 is formed. On p-type InP clad layer 13, p-electrodes 10 to 12 are provided. The p-electrode 10 is formed for saturable absorption region 4, and p-electrodes 11 and 12 are formed for optical amplification regions 5 and 6, respectively. On n-type InP substrate 9, n-electrode 15 is formed, opposite to p-electrodes 10 to 12.

To optical amplification regions 5 and 6, current is injected through p-electrodes 11 and 12, respectively. To saturable absorption region 4, a voltage is applied through p-electrode 10, independent from optical amplification regions 5 and 6. The input light Pin injected through plane of incidence 7 is generated by adding optical noise of white noise, to a light signal having binary intensity of "1" or "0".

Saturable absorption region 4 and optical amplification regions 5 and 6 are formed satisfying conditions to have semiconductor optical amplifier device 1 serve as a semiconductor laser in the bistable state. When current is injected to optical amplification regions 5 and 6, semiconductor optical amplifier device 1 reaches the bistable state and starts operation. The length of saturable absorption region in the direction of resonator is set, for example, to about 10% of the entire length of the resonator. Here, the direction of resonator corresponds to the direction of progress of input light Pin and output light Pout of FIG. 1.

In semiconductor optical amplifier device 1, corresponding to division of active layer 2 into three, that is, saturable absorption region 4 and optical amplification regions 5 and 6, three divided p-electrodes 10 to 12 are provided. Specifically, semiconductor optical amplifier device 1 in accordance with Embodiment 1 has such a structure that allows more independent, easier control of the voltage applied to saturable absorption region 4 and currents respectively applied to optical amplification regions 5 and 6.

By the structure described above, mutual interference between the voltage applied to saturable absorption region 4 and the currents flowing through optical amplification regions 5 and 6 can be avoided. Though an example in which n-electrode 15 is not divided is shown in FIG. 1, it is by way of example only, and n-electrode 15 may also be divided in correspondence with p-electrodes 10 to 12. In that case, though the step of dividing the electrode is additionally required in the process for manufacturing the semiconductor optical amplifier device, interference between the voltage applied to saturable absorption region 4 and the currents flowing through optical amplification regions 5 and 6 can more reliably be avoided.

Next, an operation of semiconductor optical amplifier device 1 will be described. In the following, light having non-periodical, random intensity variation and additionally injected to the active layer as noise to the light signal will be referred to as "additional optical noise", which is distinguished from noise derived from transmission path and the like.

FIGS. 2 to 5 illustrates how the input light Pin to active layer 2 of semiconductor optical amplifier device 1 is generated, in accordance with Embodiment 1 of the present invention.

Figure 2:
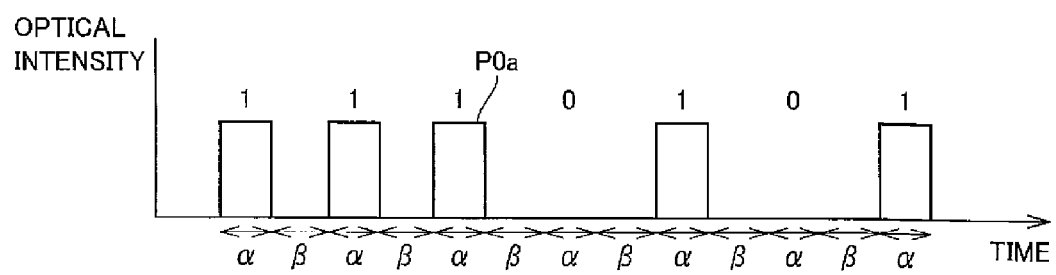
FIG. 2 shows time waveform of a light signal P0a before deterioration, having binary value of "1" or "0".
Figure 3:
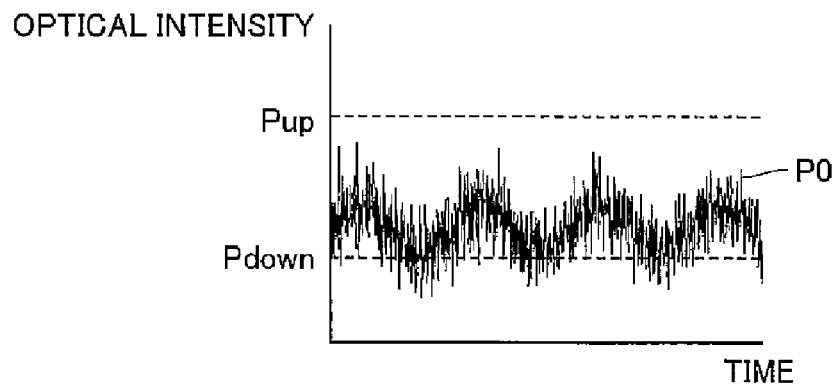
FIG. 3 shows time waveform of a light signal P0 after deterioration, having binary value of "1" or "0".
Figure 4:
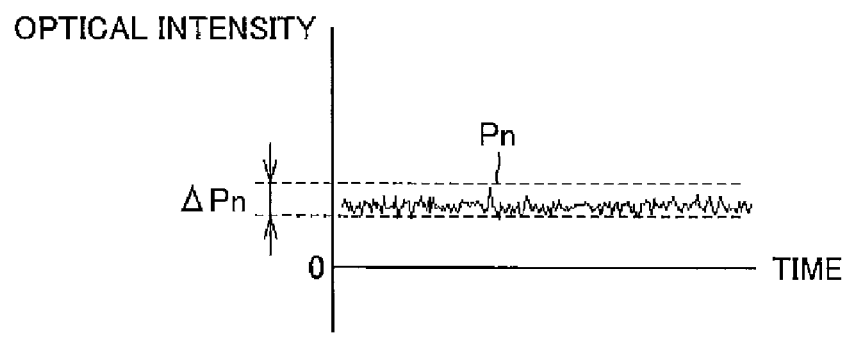
FIG. 4 shows time waveform of an additional optical noise Pn added to light signal P0.

FIG. 2 shows time waveform of a light signal P0a before deterioration, having binary value of "1" or "0". As shown in FIG. 2, the binary light signal P0a is of the RZ (Return to Zero) code system, in which no matter whether the signal is "1" or "0" in signal period α, the signal always returns to "0" in the next period β. FIG. 3 shows time waveform of a light signal P0a after deterioration, having binary value of "1" or "0". FIG. 4 shows time waveform of the additional optical noise Pn. In the following, difference ΔPn between the maximum and minimum values of additional optical noise Pn will be referred as noise intensity of additional optical noise Pn.

Figure 5:
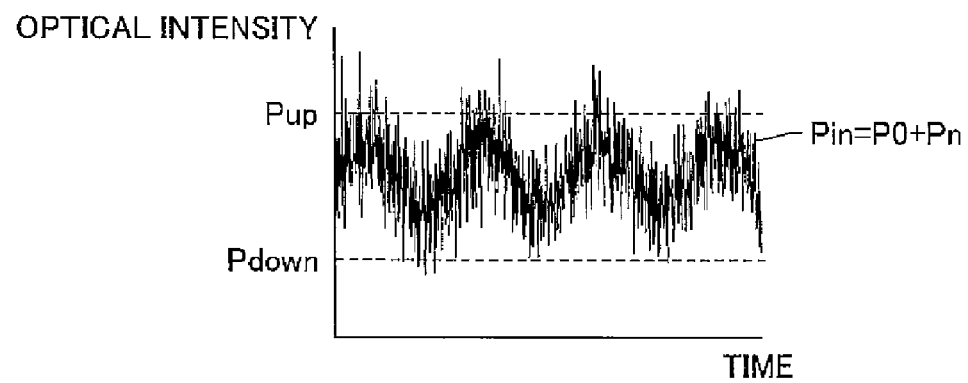
FIG. 5 shows time waveform of an input light Pin=P0+Pn, having additional optical noise Pn added to light signal P0.

FIG. 5 shows time waveform of an input light Pin=P0+Pn, having additional optical noise Pn of FIG. 4 added to light signal P0 of FIG. 3. Here, Pup and Pdown on the ordinate represent intensity levels of input light Pin that correspond to codes of "1" and "0", respectively. When compared at positions of Pup and Pdown on the ordinate, it can be seen that because of the additional optical noise Pn, amplitude of input light Pin is slightly increased from that of light signal P0. As shown in FIG. 5, additional optical noise Pn is weak enough not to affect the signal positions of "1" and "0" of the light signal P0.

The input light Pin generated in the above-described manner is injected to active layer 2 of semiconductor optical amplifier device 1 shown in FIG. 1. The input light Pin enters plane of incidence 7 of semiconductor optical amplifier device 1 from a light source, not shown. Input light Pin assumes binary value of "1" or "0" and generally, deteriorated by noise derived from external transmission path and the like.

Figure 6:
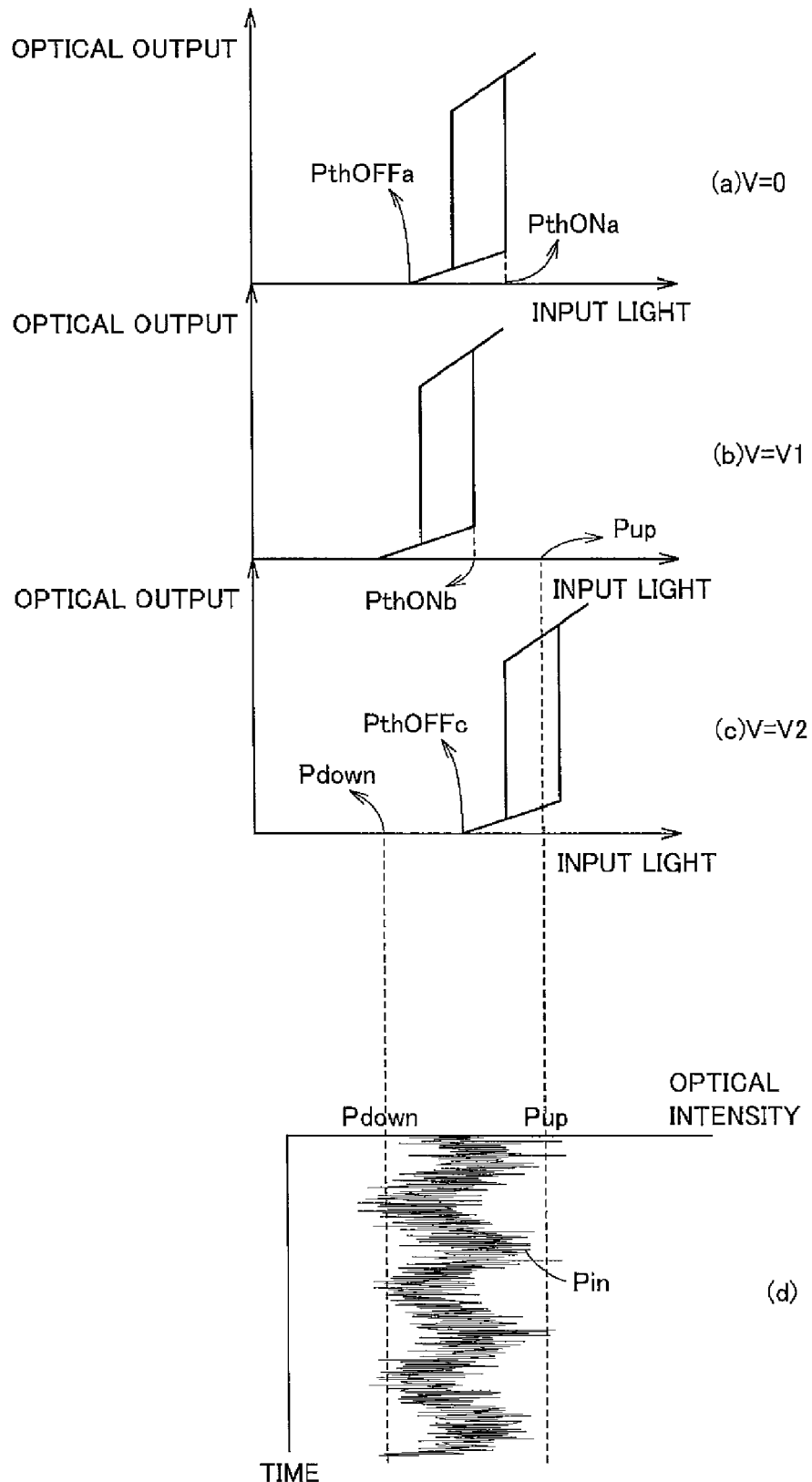
FIG. 6 shows variation of input light-optical output characteristic in accordance with application of a bias voltage to a saturable absorption region 4 in a semiconductor optical amplifier device 1.
Figure 7:
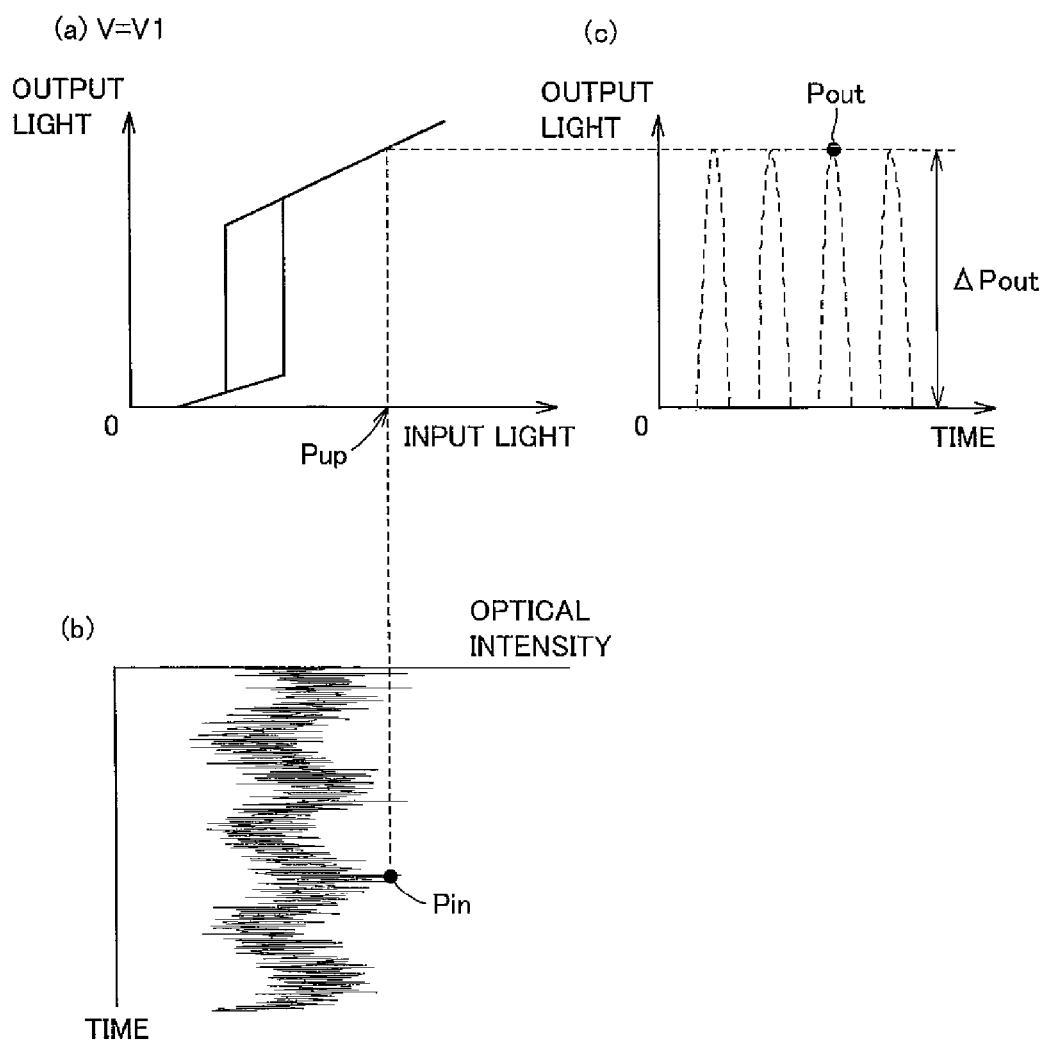
FIG. 7 shows input light-optical output characteristic when bias voltage V=V1 is applied to saturable absorption region 4 in semiconductor optical amplifier device 1.
Figure 8:
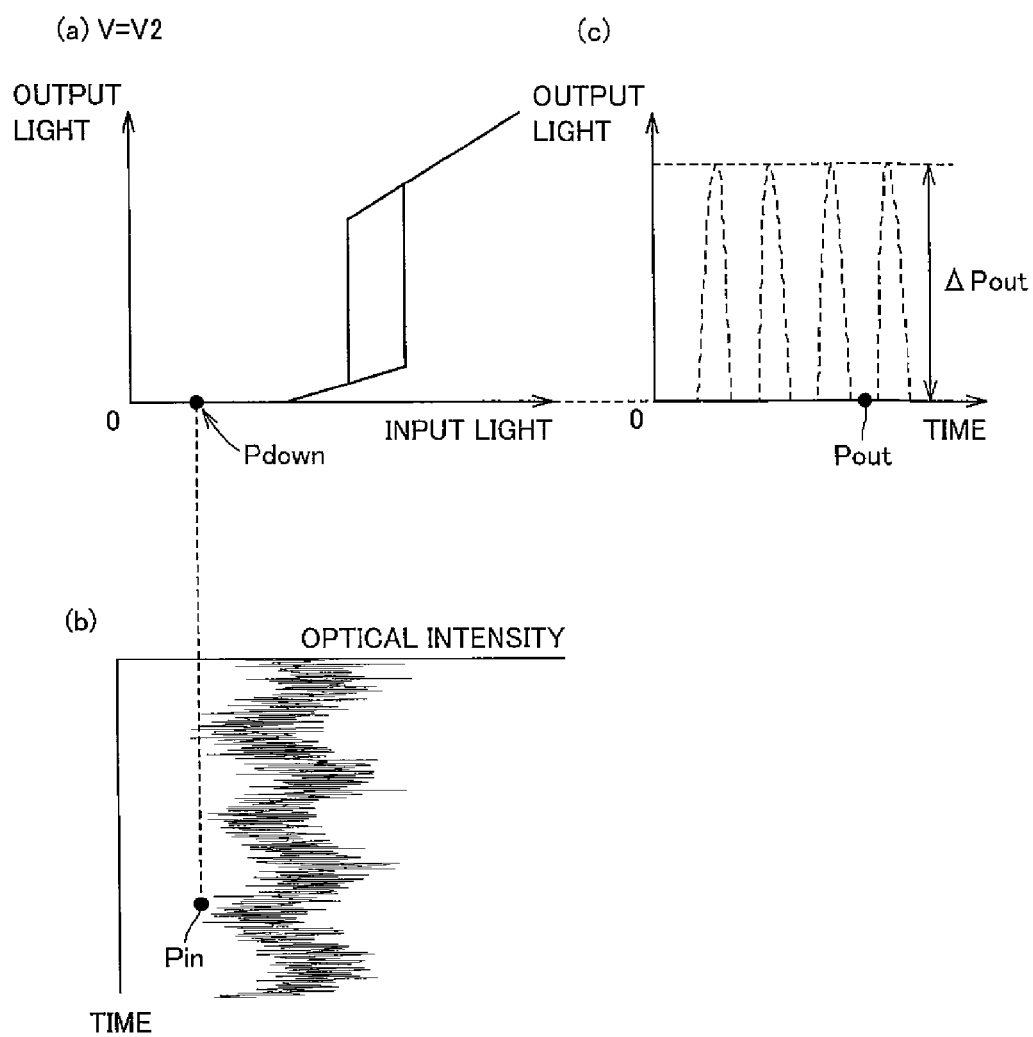
FIG. 8 shows input light-optical output characteristic when reverse bias voltage V=V2 is applied to saturable absorption region 4 in semiconductor optical amplifier device 1.
Figure 14:
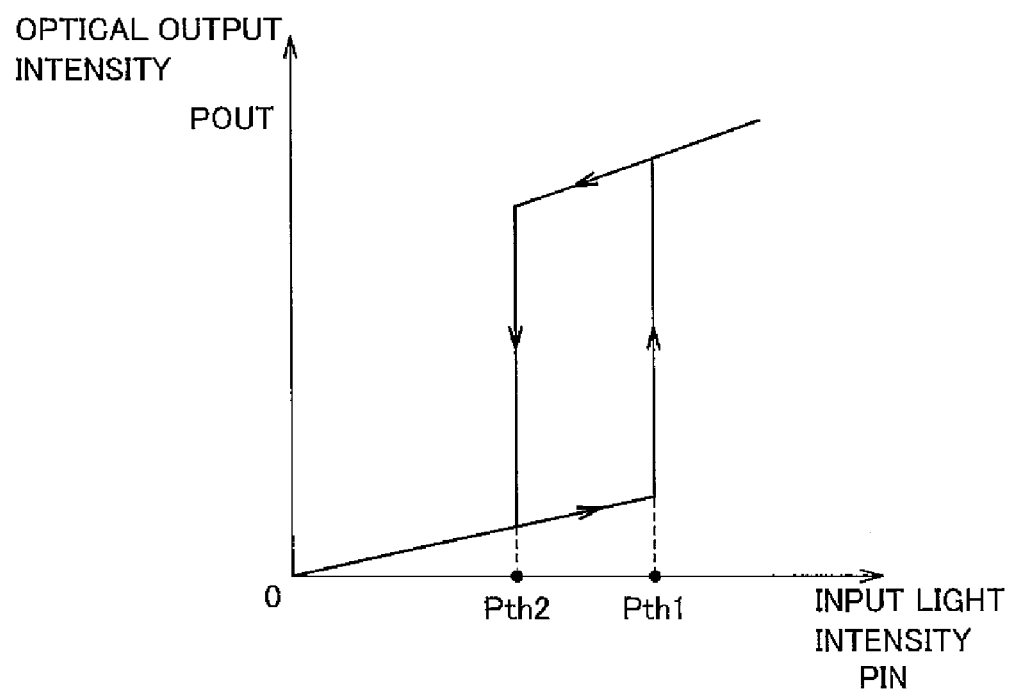
FIG. 14 shows an injection Light-optical output characteristic curve of a general bistable semiconductor laser having a saturable absorption region.
Figure 15:
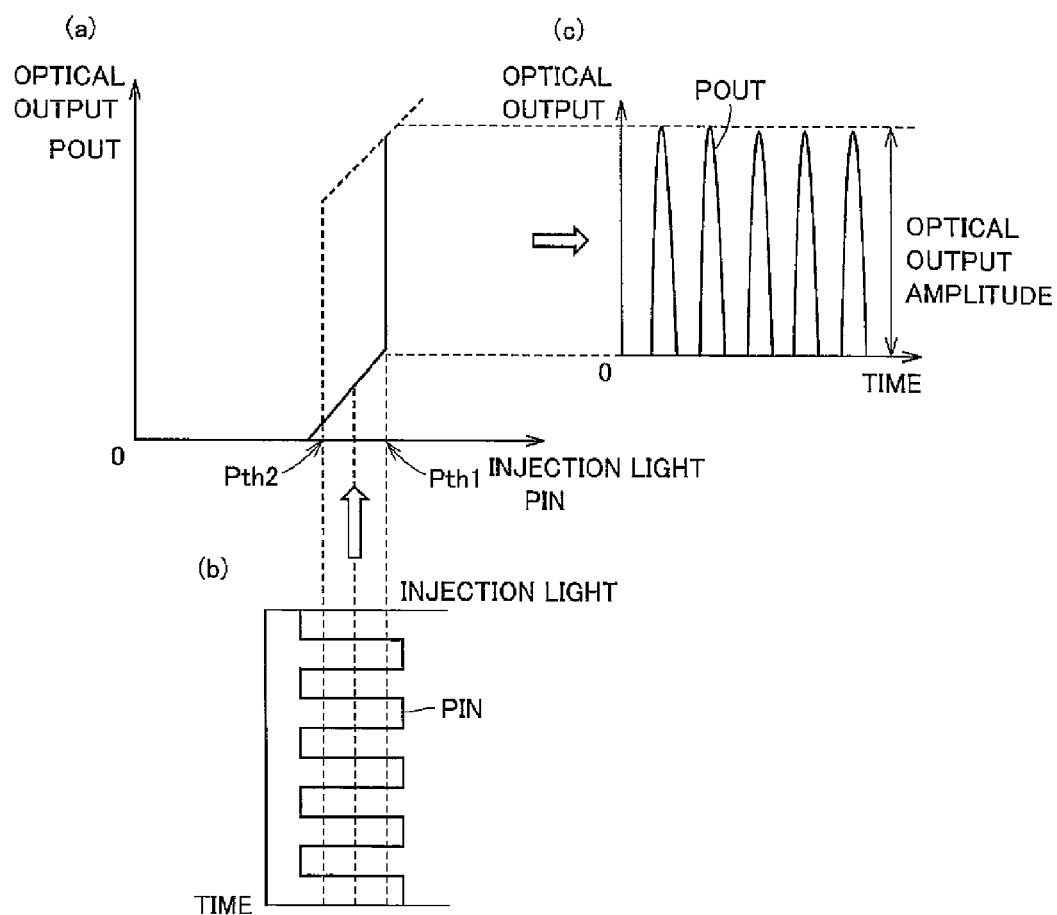
FIG. 15 (a) shows an injection light-optical output characteristic curve of the bistable semiconductor laser shown in FIG. 14.
Figure 16:
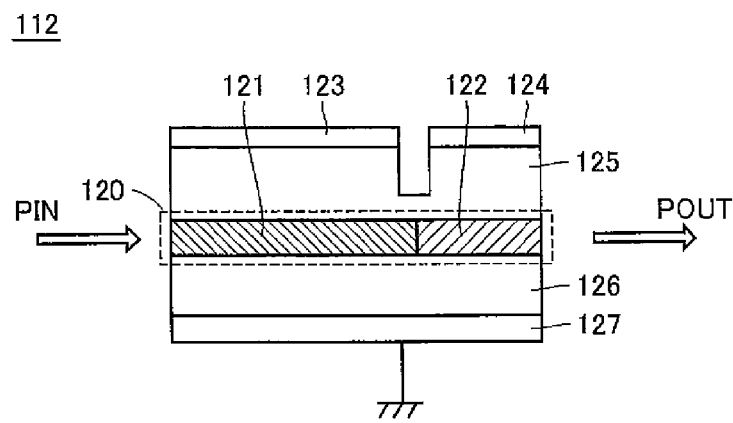
FIG. 16 is a cross-sectional view showing a structure of a general bistable semiconductor laser 112 used as a stochastic resonance apparatus.
Figure 17:
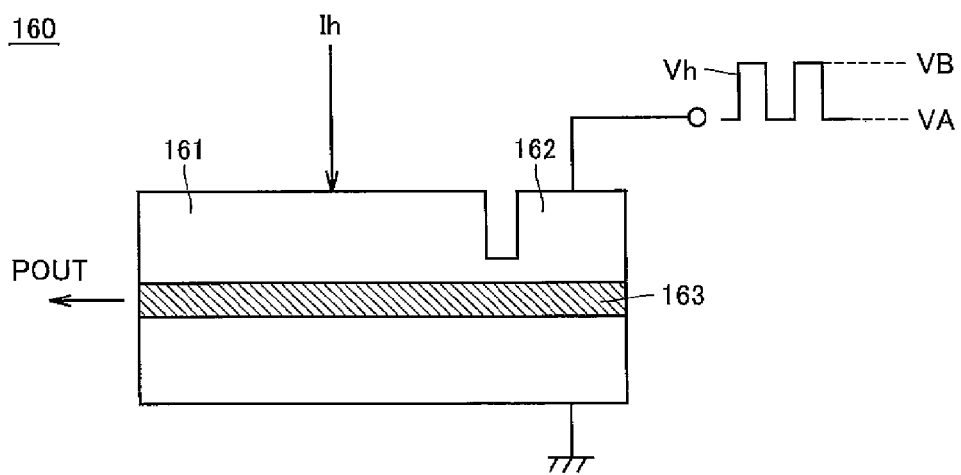
FIG. 17 is a cross-sectional view showing a schematic device structure of a conventional semiconductor laser device 160 in the bistable state.
Figure 18:
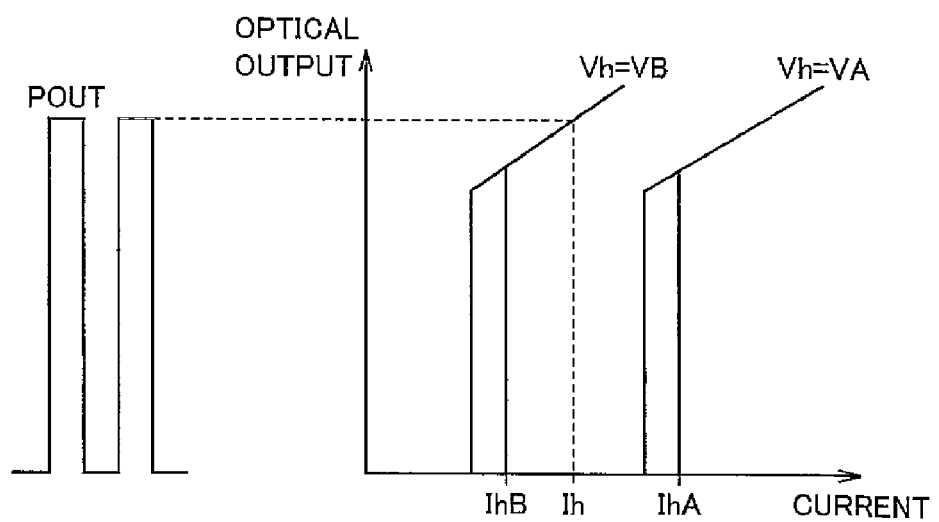
FIG. 18 illustrates an operation of semiconductor laser device 160 in the bistable state shown in FIG. 17.

FIGS. 6 to 8 illustrate operation characteristics of semiconductor optical amplifier device 1 in accordance with Embodiment 1 of the present invention (see also description of FIG. 14).

In FIG. 6, (a) shows input light-optical output characteristic when bias value V=0, that is, no bias is applied to saturable absorption region 4, in semiconductor optical amplifier device 1 of FIG. 1. In FIG. 6, (b) shows input light-optical output characteristic when bias to saturable absorption region 4 has bias value V=V1, in semiconductor optical amplifier device 1 of FIG. 1. In FIG. 6, (c) shows input light-optical output characteristic when bias to saturable absorption region 4 has reverse bias value V=V2, in semiconductor optical amplifier device 1 of FIG. 1. In FIG. 6, (d) represents time waveform of input light Pin described with reference to FIG. 5.

Referring to FIG. 6(a), PthONa represents optical intensity at which the state of optical output makes a state transition from a lower portion of hysteresis to an upper portion of hysteresis, of the input light-optical output characteristic, that is, the rising threshold value of hysteresis. PthOFFa represents optical intensity when the state of optical output moves from the upper portion of hysteresis to the lower portion of hysteresis and attains approximately zero. When bias V1 is applied to saturable absorption region 4 of semiconductor optical amplifier device 1, hysteresis of FIG. 6(a) changes to that of FIG. 6(b), and PthONa of FIG. 6(a) changes to PthONb of FIG. 6(b). When reverse bias V2 is applied to saturable absorption region 4 of semiconductor optical amplifier device 1, hysteresis of FIG. 6(a) changes to that of FIG. 6(c), and PthOFFa of FIG. 6(a) changes to PthOFFc of FIG. 6(c).

Pup shown in FIG. 6(b) corresponds to "1" of input light Pin of FIG. 6(d), and if the optical output is at the upper portion of hysteresis at Pup, the optical output attains to the ON state. Pdown shown in FIG. 6(c) corresponds to "0" of input light Pin of FIG. 6(d), and if the optical output is at the state of approximately zero and at the lower portion of hysteresis at Pdown, the optical output attains to the OFF state. Therefore, by setting up/down the hysteresis such that it attains to the ON state at a timing when input light Pin is "1" and it attains to the OFF state at a timing when input light is "0", output light Pout that reflects "1" and "0" of the input light can be obtained.

FIG. 7(a) shows input light-optical output characteristic when bias voltage V=V1 is applied to saturable absorption region 4 in semiconductor optical amplifier device 1 of FIG. 1. FIG. 7(b) shows time waveform of input light Pin described with reference to FIG. 6(d). FIG. 7(c) represents time waveform (instantaneous value) of output light Pout obtained as a result of injection of input light Pin to semiconductor optical amplifier device 1 to which bias voltage V=V1 is applied. In FIG. 7(a), the abscissa represents input light and the ordinate represents optical output obtained in accordance with the input light, respectively.

As shown in FIG. 7(a), when transition to the upper portion of hysteresis is made with the optical intensity Pup corresponding to "1" of input light Pin, a large optical output corresponding to Pup can be obtained as shown in FIG. 7(c), and a high peak corresponding to "1" appears in the output light Pout. Here, output light Pout amplified and reflecting "1" is obtained.

FIG. 8(a) shows input light-optical output characteristic when reverse bias voltage V=V2 is applied to saturable absorption region 4 in semiconductor optical amplifier device 1 of FIG. 1. FIG. 8(b) shows time waveform of input light Pin described with reference to FIG. 6(d). FIG. 8(c) represents time waveform (instantaneous value) of output light Pout obtained as a result of injection of input light Pin to semiconductor optical amplifier device 1 to which reverse bias voltage V=V2 is applied. In FIG. 8(a), the abscissa represents input light and the ordinate represents optical output obtained in accordance with the input light, respectively.

As shown in FIG. 8(a), when transition to the lower portion of hysteresis is made with optical intensity Pdown corresponding to "0" of input light Pin, approximately zero optical output corresponding to Pdown is obtained as shown in FIG. 8(c), and the output light assumes a value close to zero, which corresponds to "0". In this case, output light Pout reflecting "0" is obtained.

Again referring to FIG. 3, intensity of light signal P0 before adding the additional optical noise Pn is so deteriorated that the maximum value cannot exceed the rising threshold value of hysteresis. Therefore, when the light signal Pin obtained by adding the additional optical noise Pn of FIG. 4 to the light signal P0 of FIG. 3 is simply injected to active layer 2 of semiconductor optical amplifier device 1 of FIG. 1, the optical output remains at the lower portion of hysteresis on the input light optical output characteristic curve of FIG. 6(a) and cannot move to the upper portion of hysteresis. Thus, when no bias is applied to saturable absorption region 4, optical output corresponding to the ON state cannot be obtained, and therefore, the optical output reflecting "0" and "1" of the light signal P0 cannot be obtained.

Therefore, the bias voltage V that fluctuates with the same period as the input light Pin is applied to saturable absorption region 4. As the input light Pin is an RZ signal, it returns to the OFF state immediately after the position (signal position) where information of "1" or "0" is indicated by the presence/absence of a pulse (Return to Zero). Specifically, no matter whether the signal position is "1" and the pulse exists or it is "0" and no pulse exists, the input light Pin once assumes "0" without fail before the next signal position.

Specifically, to saturable absorption region 4 of semiconductor optical amplifier device 1, forward bias of V=V1 is applied at the signal position of input light Pin, and at the position where the signal returns to zero level (OFF state of optical output) determined by the RZ code, reverse bias of V=V2 is applied. As described above, the input light Pin is an Rz signal and, therefore, the signal position and the immediately following timing to return to zero are fixed by the period of input light Pin.

Further, the input light Pin of FIG. 5 is injected to active layer 2 of semiconductor optical amplifier device 1. Then, as shown in FIG. 6(b), optical intensity exceeds the rising threshold value PthONb of hysteresis near the maximum value "1" of input light Pin, and the optical output moves to the upper portion of hysteresis on the input light-optical output characteristic curve of FIG. 5(b). While the forward bias V1 is applied to saturable absorption region 4, the rising threshold value of hysteresis is PthONb, as shown in FIG. 6(b). At this time, the rising threshold value is lower than PthONa when the bias is not applied, shown in FIG. 6(a), and therefore, the hysteresis can be exceeded by simply adding smaller noise.

As the input light Pin is an RZ code, it always returns once to the zero level (OFF state), immediately after the signal position. Therefore, past the maximum value of input light Pin, the optical output always decreases, and in synchronization with the zero level determined by the RZ code, reverse bias V2 is applied to saturable absorption region 4. At this time, falling threshold value of hysteresis is PthOFFc as shown in FIG. 6(c), and the falling threshold value is lower than PthOFFa when the bias is not applied, shown in FIG. 6(a). Therefore, near the minimum value "0" of input light Pin, the optical output becomes lower than PthOFFc, and the optical output moves to lower portion of hysteresis on the input light-optical output characteristic curve of FIG. 6(c).

At this time, applying a reverse bias to saturable absorption region 4 is equivalent to drawing out carriers remaining in saturable absorption region 4. In semiconductor optical amplifier device 1, response deteriorates when carrier life in saturable absorption region 4 is longer, so that it does not assume the OFF state even at the signal position of "0", resulting in poor S/N ratio or disturbed waveform due to the pattern effect. By drawing out the carriers remaining in saturable absorption region 4 as described above, such problems can be solved.

As described above, as the input light Pin exceeds the rising/falling threshold value, the output light Pout goes above and below the hysteresis. Thus, optical intensity of output light Pout increases/decreases rapidly. As a result, as can be seen from (c) of FIGS. 7 and 8, output light Pout of large amplitude, emphasizing "1" and "0" of the light signal P0, can be obtained.

The additional optical noise Pn and bias V may be adjusted appropriately such that output light Pout comes to have noise intensity attaining the effect of reducing bit error rate caused by the transmission path and the like.

If the bias V applied to saturable absorption region 4 at the timing when the light signal Pin attains to "1" is too small, the optical output cannot move to the upper portion of hysteresis, and hence, "1" of the input signal cannot be reflected. Further, if the bias V applied to saturable absorption region 4 at the timing when the light signal Pin attains to "0" is too small, the optical output cannot move to the lower portion of hysteresis, and hence, "0" of the input signal cannot be reflected. Further, if the value of bias V is too small, the effect of drawing accumulated carriers described above cannot sufficiently be attained, and it becomes difficult to alleviate the pattern effect.

On the other hand, if the value of bias V is too large, the optical output moves to upper portion of hysteresis regardless of "1" or "0" of the light signal P0 and, therefore, output light Pout comes to have random intensity variation. As a result, it becomes impossible to reduce bit error rate and, in addition, power consumption increases.

If the noise intensity of additional optical noise Pn is too small, the optical output cannot move to the upper portion of hysteresis, and the output light Pout having an amplitude sufficiently large to reduce bit error rate caused by transmission path and the like cannot be obtained. Further, if the noise intensity of additional optical noise Pn is too large, the output light Pout moves to the upper portion of hysteresis regardless of "1" or "0" of the light signal P0 and, therefore, output light Pout comes to have random intensity variation. As a result, it becomes impossible to reduce bit error rate.

Figure 9:
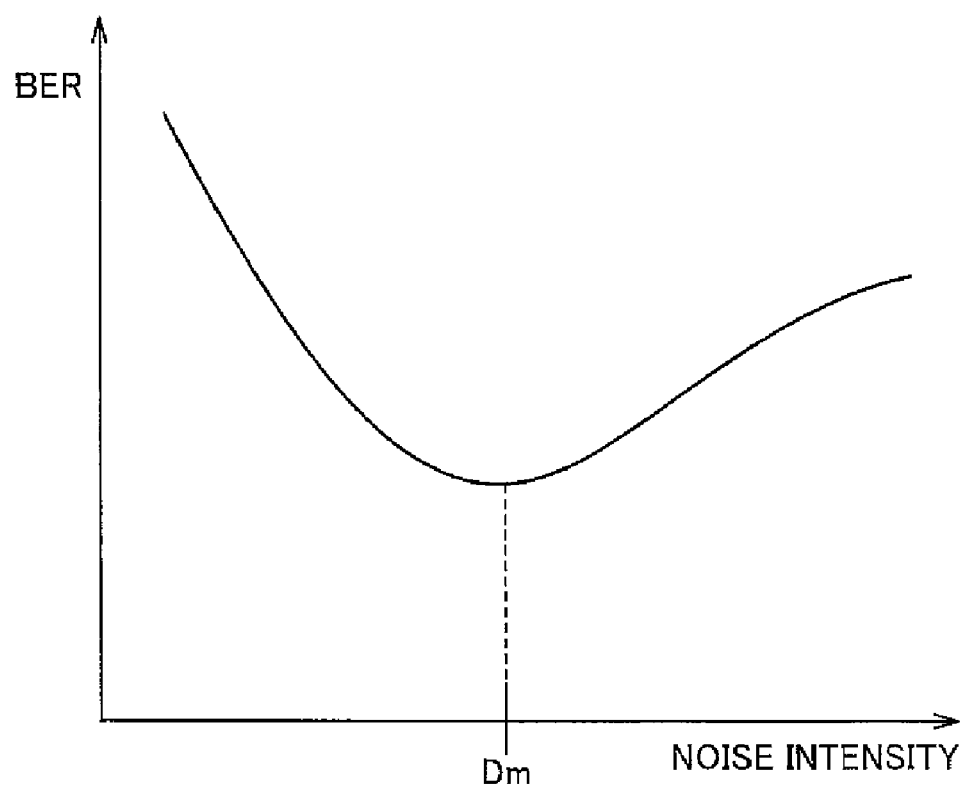
FIG. 9 shows bit error rate (BER) of output light Pout when noise intensity of additional optical noise Pn is changed.

FIG. 9 shows bit error rate (BER) of output light Pout when noise intensity of additional optical noise Pn is changed.

As shown in FIG. 9, BER is minimized with optimal noise intensity Dm. In Embodiment 1, additional optical noise Pn having the optical noise intensity Dm is added to light signal P0. Thus, appropriate additional optical noise Pn raises weak light signal P0 to upper portion of hysteresis, enabling generation of output light Pout having large amplitude and improved S/N ratio. In Embodiment 1, additional optical noise Pn is adjusted to have the optimal noise intensity Dm that attains minimum BER of the output light Pout.

As described above, additional optical noise Pn is appropriately adjusted to have the noise intensity that can attain the effect of reducing bit error rate, and injected, together with light signal P0, to optical amplification regions 5 and 6 of semiconductor optical amplifier device 1 shown in FIG. 1. Referring to FIG. 6(b), the value of rising threshold value PthONb of semiconductor optical amplifier device 1 is adjusted to such a level that the optical output obtained when only the light signal P0 is injected to optical amplification regions 5 and 6 without applying the bias V to saturable absorption region 4 attains only a small value corresponding to the lower portion of hysteresis. Specifically, the threshold value is adjusted to such a level that when bias V is not applied to saturable absorption region 4, noise caused by transmission path and the like cannot be reduced.

Further, by adding additional optical noise Pn with the noise intensity adjusted appropriately to the light signal P0, the value of input light Pin is caused to vary at random with the value of light signal P0 being the center.

Here, the maximum value and/or minimum value of light signal P0 and the intensity of additional optical noise Pn injected to optical amplification regions 5 and 6 together with light signal P0 synchronize stochastically, and the optical output moves to upper/lower portion of hysteresis at the timing when the light signal P0 assumes "0" or "1". Therefore, output amplitude of the output light increases in accordance with the intensity difference between the upper and lower portions of hysteresis, and thus, output light Pout having large amplitude can be obtained.

The phenomenon that the S/N ratio of a signal is improved by appropriately adding noise is called "stochastic resonance."

Therefore, in semiconductor optical amplifier device 1 in accordance with Embodiment 1, by the change in shape of hysteresis realized by applying bias to saturable absorption region 4 and by the addition of noise to the optical input, the bit error rate of the output light Pout derived from transmission path and the like can be reduced.

As described above, in semiconductor optical amplifier device 1 in accordance with Embodiment 1, the bias value applied to saturable absorption region 4 is changed timed with the light signal P0 attaining the maximum value and/or minimum value, to better realize stochastic synchronization, whereby the effect of signal amplification and reproduction can be improved. Further, as the bias applied to saturable absorption region 4 at the timing of light signal P0 attaining to the minimum value is set to reverse bias, the effect of drawing out carriers left in the saturable absorption region 4 can simultaneously be attained. Thus, higher speed of response of light signal P0 than the carrier life of saturable absorption region 4 becomes possible, and hence the device can handle high-frequency pulse signals.

Therefore, using the semiconductor optical amplifier device 1 in accordance with Embodiment 1, it is possible to receive a light signal P0 attenuated and deteriorated below the oscillation threshold of the device, and to obtain an optical output amplified and having binary value emphasized. Thus, S/N ratio of the optical output is improved, and the output light Pout with the noise derived from transmission path and the like reduced, can be obtained with low power.

Further, utilizing stochastic resonance phenomenon, the signal amplifying effect can be attained with smaller voltage fluctuation than in the conventional driving method of applying bias to saturable absorption region 4. Thus, the effect of reducing power consumption can also be attained.

Further, in the semiconductor optical amplifier device 1 shown in FIG. 1, current is injected to optical amplification regions 5 and 6, and therefore, hysteresis can be controlled by the current injection. Thus, it is possible to set lower the rising threshold value PthON to enable driving with lower current and to adjust amplitude of output light Pout.

It may be possible to cause transition to upper portion of hysteresis by adding optical clock or periodical light signal to light signal P0 in place of the additional optical noise Pn. In that case, however, output light Pout of large amplitude cannot be obtained unless the phase and period are perfectly the same as those of the light signal P0 or exactly the multiples thereof so that maximum values of these are synchronized. Therefore, if the waveform of light signal P0 should waver because of thermal noise of the circuitry, for example, the effect of reducing noise derived from transmission path and the like would be diminished.

In contrast, the additional optical noise Pn with random intensity variation involves various frequency components and, therefore, it is robust against wavers of signal waveform and, hence, it can maintain the effect of reducing bit error rate derived from the transmission path and the like. Further, optical noise consumes less power than periodical light signal.

Further, in order to excite laser with even a weak signal, generation of additional optical noise in accordance with the present invention consumes less power than injection of large constant current as in the conventional bistable semiconductor optical amplifier device.

Further, as the additional optical noise Pn robust against signal wavers caused by circuit noise or heat is used, parameters can be set in wider ranges at the time of driving. Consequently, noise derived from the transmission path and the like can be reduced easily, and as a result, bit error rate of the output light Pout can be reduced.

Referring to FIG. 1, it is possible to obtain the output light Pout with reduced bit error rate even when plane of incidence 7 and emission plane 8 are not formed separately. However, separate provision of plane of incidence 7 and emission plane 9 shown in FIG. 1 is desirable as it becomes easier to control input light Pin and output light Pout independent from each other and easier to adjust optical axis of the optical system.

Further, in FIG. 1, the length occupied by saturable absorption region 4 in the resonator direction is not limited to about 10% to attain the effect of reducing bit error rate.

If the ratio of the length occupied by saturable absorption region 4 in the resonator direction becomes smaller, however, it becomes more difficult to realize bistable state of semiconductor optical amplifier device 1. Particularly, when a semiconductor device of bistable state is to be fabricated with the ratio being smaller than 1%, manufacturing process becomes extremely troublesome and selection of diffusion material becomes very difficult. Therefore, it is desirable that the ratio of the length of saturable absorption region 4 in the resonator direction is at least 1%.

On the contrary, if the ratio of the length occupied by saturable absorption region 4 in the resonator direction becomes larger, it becomes necessary to increase the injection current to optimize the hysteresis shape, and hence, oscillation threshold increases accordingly. Particularly, when the ratio exceeds 50%, power consumption increases significantly, resulting in much heat generation. Further, if the hysteresis shape is not optimal, the effect of reducing bit error rate caused by the transmission path and the like is diminished and the amplitude of output light Pout decreases.

From these reasons, the ratio of the length occupied by saturable absorption region 4 in the resonator direction should desirably be at least 1% and at most 50%. With this range, the bistable state can easily be satisfied, oscillation frequency can be made lower and good shape of hysteresis can be determined. Further, it becomes easier to reduce bit error rate derived from the transmission path and the like with smaller heat and smaller power consumption, and easier to satisfy conditions of manufacturing the device.

Further, referring to FIG. 9, intensity of additional optical noise Pn is adjusted to the optimal noise intensity Dm at which BER is minimized. The intensity of additional optical noise Pn is not limited to this value, and the noise intensity may be in the range that the resulting output light Pout realizes BER value required for optical communication. By way of example, if the noise intensity of additional optical noise Pn is at most 1/10 of the amplitude of input light Pin of semiconductor optical amplifier device 1, the output light Pout with reduced bit error rate can be obtained.

If the intensity of additional optical noise Pn is too high, the waveform of output light Pout deteriorates and, hence, noise reduction is not realized. Specifically, if noise intensity ΔPn of additional optical noise Pn is larger than the amplitude of light signal P0, it becomes impossible to reproduce the waveform and period of light signal P0 and, therefore, the light signal P0 cannot be detected. In contrast, if the noise intensity of additional optical noise Pn is 1/10 of the amplitude of input light Pin or smaller, amplitude of output light Pout can further be increased, and the value of BER can be reduced. Thus, such a value is preferred, as the effect of reducing bit error rate derived from the transmission path and the like can be improved.

Though white noise is used as the additional optical noise in Embodiment 1, noise other than white noise may be used to attain the effect of reducing bit error rate, so long as the intensity variation is non-periodic and at random.

Though an example in which three p-electrodes 10 to 12 are provided has been described, the number of electrodes is not limited to three, and in other semiconductor optical amplifier device having bistable state using two or more p-electrodes, it is possible to attain the effect of reducing bit error rate derived from the transmission path and the like. Providing two optical amplification regions 5 and 6 and forming corresponding p-electrodes 11 and 12 as in the semiconductor optical amplifier device 1 shown in FIG. 1, however, is advantageous in that independent control of input light Pin and output light Pout becomes easier.

Further, additional optical noise Pn may be injected to optical amplification regions 5 and 6 of semiconductor optical amplifier device 1 not after it is added to light signal P0 but independent from light signal P0. In that case, though an extra circuitry and adjustment of optical axis become necessary, adjustment of noise intensity becomes easier.

Further, semiconductor optical amplifier device 1 is not limited to an InGaAs semiconductor and, by way of example, a semiconductor laser using AlGaAs (aluminum gallium arsenide), InP (indium phosphide) GaInNAs (gallium indium nitride arsenide), GaN (gallium nitride) or II-VI group semiconductor may be available.

Further, to the portion of saturable absorption region 4 of active layer 2 in semiconductor optical amplifier device 1, Si as an impurity may be added for adjusting carrier life. In that case, it is possible to change the oscillation wavelength range by adjusting the amount of Si to be added, and hence, desired oscillation wavelength range can be realized.

Further, the output light Pout output from semiconductor optical amplifier device 1 may be received by a light receiving element. In that case, part of the received output light Pout may advantageously be converted to an electric signal to be utilized, by a photo-electric converting element or the like. Further, if the semiconductor optical amplifier device 1 and the flight receiving element mentioned above are integrated on one substrate, cost can be reduced than when these are provided separately, and alignment of optical axes of semiconductor optical amplifier device 1 and of the light receiving element becomes unnecessary.

As described above, according to Embodiment 1, by applying bias to saturable absorption region 4 of semiconductor optical amplifier device 1 of bistable state and by injecting input light Pin prepared by adding additional optical noise Pn to a light signal P0 to the semiconductor optical amplifier device 1 of bistable state, an amplifier/waveform shaping device of good response characteristic can be obtained. This enables amplification/waveform shaping of high-frequency signals, a light signal P0 attenuated and deteriorated to be lower than the oscillation threshold value of the device can be received, and an output light Pout amplified and having binary value emphasized can be obtained.

From the foregoing, the SN ratio of output light Pout is improved, noise of output light Pout derived from the transmission path and the like can be reduced, and optical output with reduced bit error rate can be obtained. Further, power consumption can be reduced, and burden on the circuitry is small.

Modification 1 of Embodiment 1

A semiconductor optical amplifier device 1A as a modification of semiconductor optical amplifier device 1 in accordance with Embodiment 1 differs from the semiconductor optical amplifier device 1 shown in FIG. 1 in that additional optical noise Pn is replaced by additional noise current In. Therefore, accumulative descriptions of FIG. 1 and the like are not repeated here. In the following, the current that is non-periodic and has random intensity variation, injected to active layer 2 of semiconductor optical amplifier device 1A as noise to light signal P0, will be referred to as "additional noise current."

Figure 10:
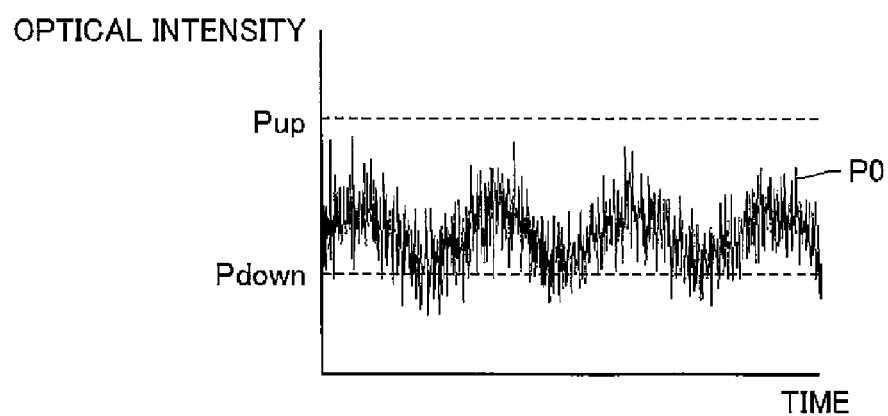
FIG. 10 shows time waveform of light signal P0 injected to a semiconductor optical amplifier device 1A.
Figure 11:
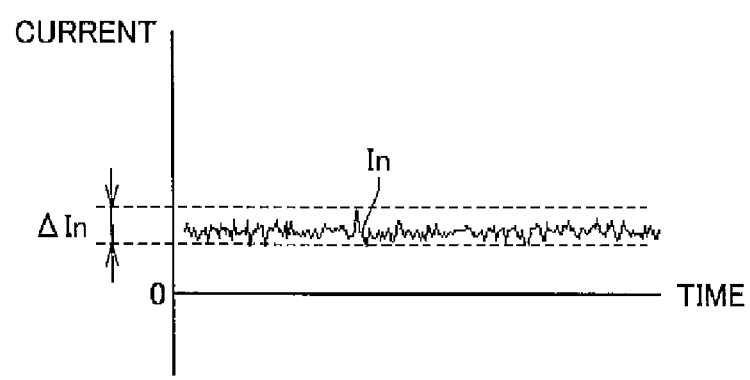
FIG. 11 shows time waveform of additional noise current in injected to semiconductor optical amplifier device 1A.

FIGS. 10 and 11 illustrate the light signal P0 to active layer 2 of semiconductor optical amplifier device 1A and additional noise current In added through p-electrodes 11 and 12.

FIG. 10 shows time waveform of light signal P0 injected to semiconductor optical amplifier device 1A. Light signal P0 shown in FIG. 10 is basically the same as the one described with reference to FIG. 3, and it is not higher than the rising threshold value PthONa of semiconductor optical amplifier device 1A of FIG. 6(*a*).

FIG. 11 shows time waveform of additional noise current In injected to semiconductor optical amplifier device 1A. White noise is used as additional noise current In. Additional noise current In is injected, together with the currents supplied through electrodes 11 and 12 of semiconductor optical amplifier device 1A, to optical amplification regions 5 and 6 in active layer 2.

Additional noise current In is adjusted appropriately to a current value such that output light Pout can realize the effect of reducing bit error rate. In the following, the difference between the maximum and minimum values of additional noise current In will be referred to as maximum amplitude ΔIn of additional noise current In.

When the current is not injected to the optical amplification region and the bias is not applied to saturable absorption region 4, the rising threshold value PthONa of hysteresis shown in FIG. 6(a) is set to be higher than the intensity of light signal P0. Therefore, simply by injecting light signal P0 to active layer 2, the output light Pout stays at the lower portion of hysteresis on input light-optical output characteristic curve of FIG. 6(a), and transition to the upper portion of hysteresis is impossible.

Therefore, near the portion where light signal P0 attains to "1", bias is applied to saturable absorption region 4 of semiconductor optical amplifier device 1A to set the rising threshold value of semiconductor optical amplifier device 1A to rising threshold value PthONb of FIG. 6(b), and additional noise current In is injected to active layer 2 of optical amplification regions 5 and 6 of semiconductor optical amplifier device 1A. To the photons injected by light signal P0 to active layer 2 of semiconductor optical amplifier device 1A, photons generated by carriers injected to active layer 2 by the injection of additional noise current In are added. Thus, photons in optical amplification regions 5 and 6 are increased, and it becomes easier for output light Pout to go over the rising threshold value PthONb.

At this time, amount of increase of carriers varies as the additional noise current In varies. Therefore, the maximum amplitude ΔIn of additional noise current In and the bias V to be applied to saturable absorption region 4 are adjusted optimally, so that rising threshold value PthOnb moves up/down in accordance with "0" or "1" of the light signal P0. Consequently, an output light Pout having desired waveform, large amplitude and improved S/N ratio can be obtained.

As described above, in Modification 1 of Embodiment 1, maximum amplitude ΔIn of additional noise current In is optimally adjusted to fully attain the effect of reducing bit error rate. As a result, noise derived from the transmission path and the like can significantly be reduced. At this time, light signal P0 may be not higher than the rising threshold value PthONb of semiconductor optical amplifier device 1A, and therefore, even a weak light signal P0 can be amplified and subjected to waveform shaping.

Though white noise is used as the additional noise current In, the effect of reducing bit error rate can be attained by any noise having non-periodic and random intensity variation, other than white noise.

As described above, according to Modification 1 of Embodiment 1, by injecting additional noise current In in place of additional optical noise Pn to active layer 2 of semiconductor optical amplifier device 1, output light Pout having desired wavelength, magnified amplitude and improved S/N ratio can be obtained.

Modification 2 of Embodiment 1

A semiconductor optical amplifier device 1B as another modification of semiconductor optical amplifier device 1 in accordance with Embodiment 1 differs from the semiconductor optical amplifier device 1 shown in FIG. 1 in that a non-linear semiconductor device having an input-output characteristic different from the semiconductor device of bistable state is used. Therefore, accumulative descriptions of FIG. 1 and the like are not repeated here. Semiconductor optical amplifier device 1B is fabricated, for example, of an InGaAsP compound semiconductor.

Figure 12:
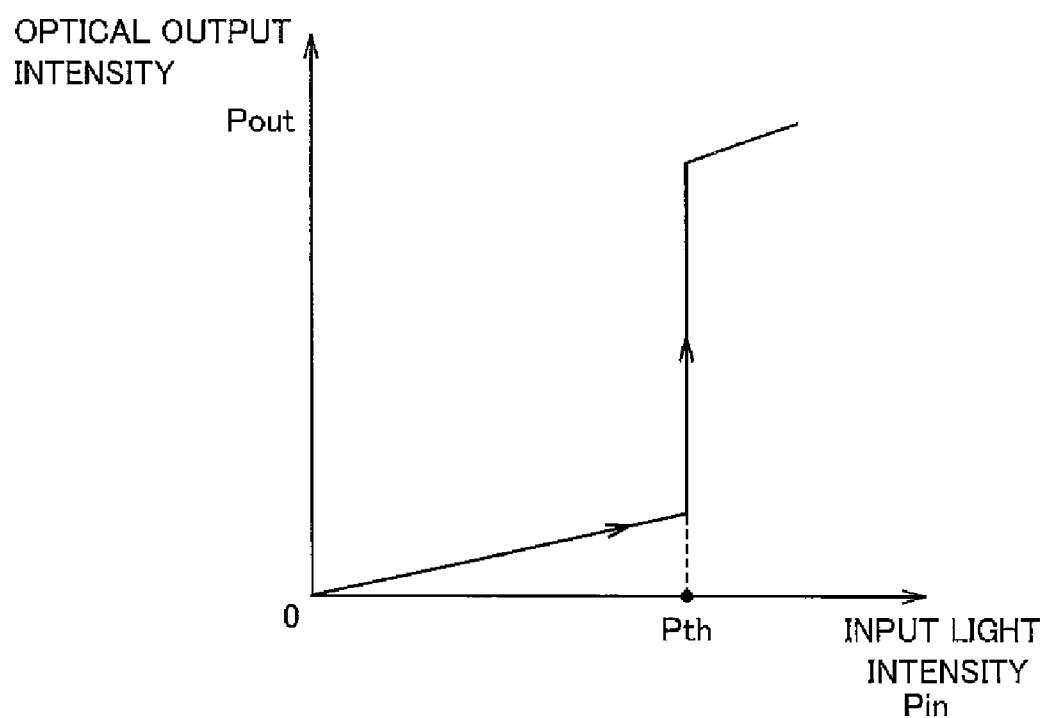
FIG. 12 shows an example of input-output characteristic of input light Pin and output light Pout of a semiconductor optical amplifier device 1B.

FIG. 12 shows an example of input-output characteristic of input light Pin and output light Pout of semiconductor optical amplifier device 1B.

As shown in FIG. 12, semiconductor optical amplifier device 1B exhibits discontinuous input-output characteristic. When a current or light is injected to active layer 2 of semiconductor optical amplifier device 1B, intensity of output light Pout rises abruptly at the threshold value Pth. With the discontinuous characteristic as shown in FIG. 12, waveform conversion between input light Pin and output light Pout is possible by utilizing the lower portion of hysteresis before the rise and the upper portion of hysteresis after the rise of the optical output.

The semiconductor optical amplifier device 1B having discontinuous input-output characteristic as described above may be obtained by making smaller the volume ratio of saturable absorption region 4 relative to optical amplification regions 5 and 6 than in the semiconductor optical amplifier device 1 of FIG. 1, or by injecting appropriate current to saturable absorption region 4 of a general bistable semiconductor laser.

As described above, according to Modification 2 of Embodiment 1, in semiconductor optical amplifier device 1B not having hysteresis but having discontinuous input-output characteristic, waveform conversion between input light Pin and output light Pout is possible by utilizing lower portion of hysteresis before the rise and upper portion of hysteresis after the rise of the optical output.

Semiconductor optical amplifier device 1B of Modification 2 may also have the function similar to that of semiconductor optical amplifier device 1 in accordance with Embodiment 1 using a bistable semiconductor laser. In Modification 2, effects of waveform conversion of input light Pin, improved S/N ratio and waveform shaping can be attained. Modification 2 of Embodiment 1 is also applicable to Modification 1 of Embodiment 1 as well as to Embodiment 2 and its modifications as will be described in the following.

Embodiment 2

Figure 13:
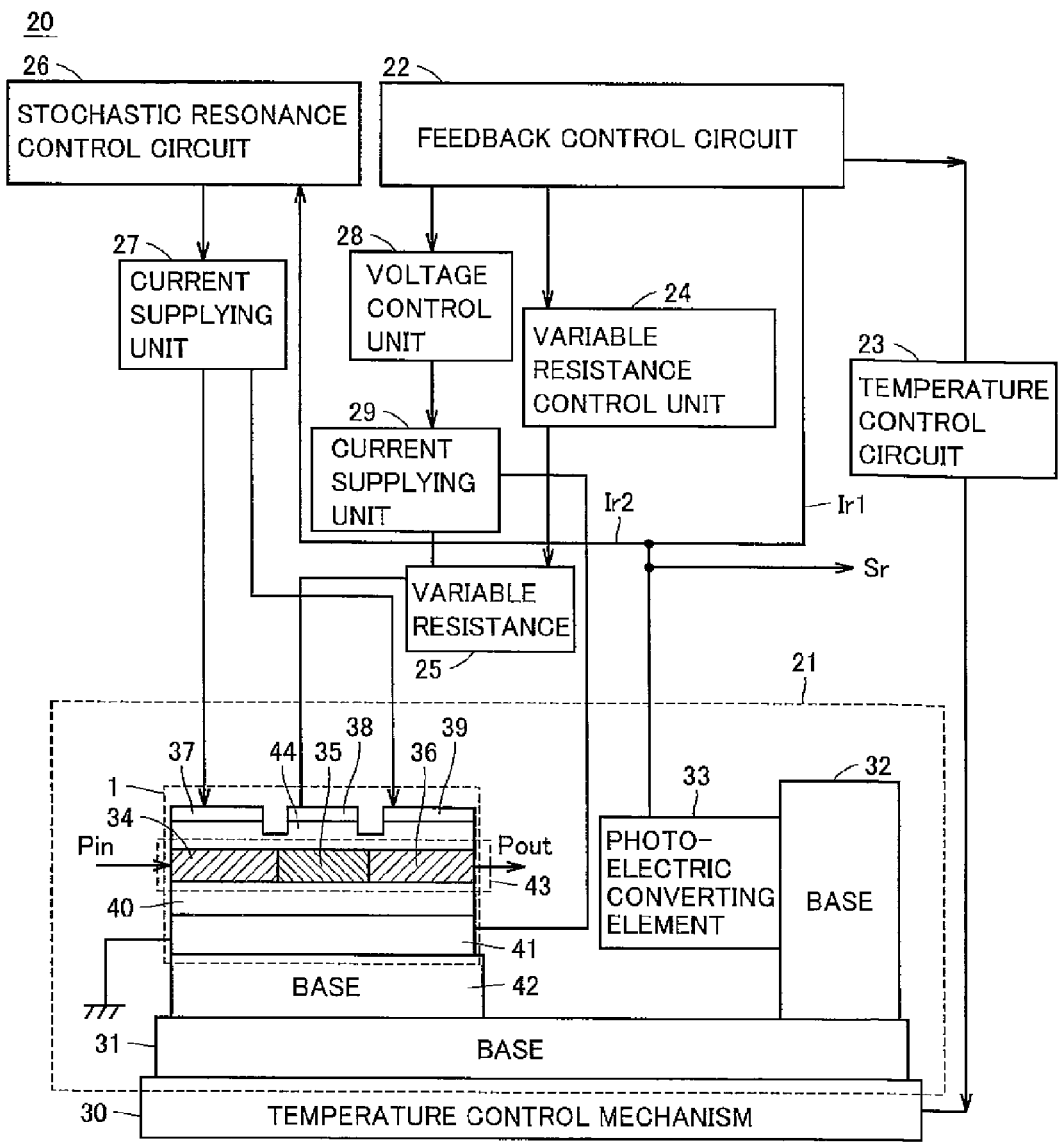
FIG. 13 shows a schematic structure of a semiconductor optical amplifier device driving apparatus 20 in accordance with Embodiment 2 of the present invention.

FIG. 13 shows a schematic structure of an apparatus 20 for driving a semiconductor optical amplifier device in accordance with Embodiment 2 of the present invention.

Referring to FIG. 13, the apparatus for driving semiconductor optical amplifier device includes a semiconductor optical amplifier module 21, a feedback control circuit 22, a temperature control circuit 23, a variable resistance control unit 24, a variable resistance 25, a stochastic resonance control circuit 26, a current supplying unit 27, a voltage control circuit 28, and a voltage supplying unit 29. Variable resistance 25 may be a variable impedance element also allowing control of its phase.

Semiconductor optical amplifier module 21 includes semiconductor optical amplifier device 1 described in Embodiment 1, a temperature control mechanism 30, bases 31, 32 and 42, and a photo-electric converting element 33. Semiconductor optical amplifier module 21 receives and internally processes an incident input light Pin and outputs a reception signal Sr, reception currents Ir1, Ir2 and so on.

Temperature control mechanism 30 is provided on semiconductor optical amplifier module 21 and formed, for example, by a Peltier cooler and a thermistor. When a Peltier cooler is used in temperature control mechanism 30, both heating and cooling become possible, and therefore, the temperature of semiconductor optical amplifier device 1 can be adjusted stably regardless of external ambient temperature.

Semiconductor optical amplifier device 1 includes: an active layer 43 including optical amplification regions 34 and 36 and a saturable absorption region 35; p-electrodes 37 to 39; clad layers 40 and 44; and an n-electrode 41. Active layer 43 has a quantum well structure.

P-electrodes 37 and 39 are formed on clad layer 44 in correspondence with optical amplification regions 34 and 36, respectively. P-electrodes 37 and 39 receive additional noise current In from current supplying unit 27. P-electrode 38 is formed in correspondence with saturable absorption region 35 on clad layer 44. P-electrode 38 is connected to variable resistance 25 and receives a voltage applied from voltage supplying unit 29. N-electrode 41 is provided between clad layer 40 and base 42. N-electrode 41 is connected to a ground node, and receives a voltage applied from voltage supplying unit 29.

Feedback control circuit 22 receives reception current Ir output from photo-electric converting element 33 of semiconductor optical amplifier module 21, and outputs a control signal to temperature control circuit 23 and variable resistance control circuit 24. Receiving the control signal from feedback control circuit 22, temperature control circuit 23 outputs temperature information to temperature control mechanism 30. Based on the temperature information from temperature control circuit 23, temperature control mechanism 30 controls temperature of semiconductor optical amplifier module 21.

In accordance with the control signal from feedback control circuit 22, variable resistance control unit 24 adjusts resistance value of variable resistance 25 connected to p-electrode 38 of semiconductor optical amplifier device 1. Receiving the reception current Ir2 from photo-electric converting element 33, stochastic resonance control circuit 26 outputs a control signal to current supplying unit 27. In accordance with the control signal from stochastic resonance control circuit 26, current supplying unit 27 supplies current with noise to p-electrodes 37 and 39 of semiconductor optical amplifier device 1. Based on the control signal from feedback control circuit 22, voltage control circuit 28 outputs a control signal to voltage supplying unit 29. In accordance with the control signal from voltage control circuit 28, voltage supplying unit 29 applies a voltage to p-electrode 38 of semiconductor optical amplifier device 1 directly or through variable resistance 25.

Temperature control circuit 23 is connected to temperature control mechanism 30. On temperature control mechanism 30, base 31 is provided. Bases 32 and 42 are provided on base 31. Semiconductor optical amplifier device 1 is mounted on base 42. Photo-electric converting element 33 is attached on base 32.

Next, an operation of the apparatus 20 for driving semiconductor optical amplifier device and the method of driving the semiconductor optical amplifier device 1 using the same will be described.

In the apparatus 20 for driving semiconductor optical amplifier device, semiconductor optical amplifier device 1 receives an input light Pin at optical amplification region 34, and emits output light Pout from optical amplification region 36, controlled by p-electrodes 37 and 39. Input light Pin assumes a binary value of "1" or "0" and generally, it is deteriorated by noise derived from the transmission path and the like.

Feedback control circuit 22 monitors the state of output light Pout through photo-electric converting element 33. Feedback control circuit 22 outputs control signals for adjusting the input-output characteristic of semiconductor optical amplifier device 1 to temperature control circuit 23, variable resistance control unit 24 and voltage control circuit 28, respectively. The input-output characteristic of semiconductor optical amplifier device 1 is basically, the same as the characteristic shown in FIG. 6.

To feedback control circuit 22, data of input-output characteristic of semiconductor optical amplifier device 1 in accordance with driving conditions such as resistance value of variable resistance 25 and detected temperature of temperature control mechanism 30 is input in advance. Based on the input data, feedback control circuit 22 calculates the temperature of temperature control circuit 23 and resistance of variable resistance 24 so that the hysteresis of input-output characteristic of the semiconductor optical amplifier device 1 comes to have a desired shape.

Temperature control circuit 23 controls the temperature of temperature control mechanism 30 in accordance with the control signal from feedback control circuit 22. Temperature control mechanism 30 increases/decreases the temperature of semiconductor optical amplifier device 1 based on the control signal from temperature control circuit 23.

Variable resistance control circuit 24 adjusts the resistance value of variable resistance 25 so that desired input-output characteristic of semiconductor optical amplifier device 1 can be attained, in accordance with the control signal from feedback control circuit 22. As the resistance value of variable resistance 25 increases/decreases, current value from saturable absorption region 35 of semiconductor optical amplifier device 1 increases/decreases. Accordingly, the amount of carriers in saturable absorption region 35 varies, and hence, the optical absorption effect can be controlled. Therefore, the apparatus 20 for driving the semiconductor optical amplifier device can control the shape of hysteresis of the input-output characteristic of the semiconductor optical amplifier device 1.

Voltage control circuit 28 controls voltage supplying unit 29 in accordance with the control signal from feedback control circuit 22. Voltage supplying unit 29 increases/decreases the voltage value to be applied to semiconductor optical amplifier device 1 in accordance with the control signal from voltage control circuit 28. The apparatus 20 for driving semiconductor optical amplifier device controls the voltage value to be applied to semiconductor optical amplifier device 1 using voltage control circuit 28 and voltage supplying unit 29. Thus, the rising threshold value and/or falling threshold value of semiconductor optical amplifier device 1 can be set higher/lower.

The apparatus 20 for driving semiconductor optical amplifier device applies, using voltage control circuit 28 and voltage supplying unit 29, a bias voltage having the same period as the input signal and varying value, to saturable absorption region 35 of semiconductor optical amplifier device 1. As the input light Pin is an RZ signal, it returns to the OFF state (Return to Zero) immediately after the position (signal position) where the information of "1" or "0" is indicated by the presence/absence of a pulse. At this time, a forward bias of V=V1 is applied at the signal position and a reverse bias of V=V2 is applied at the position where the signal returns to the zero level as defined by the RZ code (OFF state of optical output), to saturable absorption region 35 of semiconductor optical amplifier device 1. While the forward bias V1 is applied to saturable absorption region 35, the rising threshold value of hysteresis lowers. Therefore, hysteresis is exceeded near the maximum value "1" of the input light Pin, and the optical output can be controlled to the ON state.

Further, to the saturable absorption region 35 of semiconductor optical amplifier device 1, reverse bias V2 is applied in synchronization with the zero level as defined by the RZ code. Accordingly, falling threshold value of hysteresis rises and, therefore, transition to the lower portion of hysteresis becomes possible near the minimum value "0" of input light Pin. As described above, when reverse bias V2 is applied to saturable absorption region 35, residual carriers in saturable absorption region 35 are drawn out. Therefore, degradation of signal response caused by the carriers remaining in the saturable absorption region 35 or waveform deterioration caused by the pattern effect can be improved.

As described above, in the apparatus 20 for driving semiconductor optical amplifier device, as the carriers are drawn out by applying reverse bias to saturable absorption region 35, higher speed of response in signal processing becomes possible, not limited by carrier life.

Further, in the apparatus 20 for driving semiconductor optical amplifier device, the shape of hysteresis of semiconductor optical amplifier device 1 is adjusted through temperature control, variable resistance value control and current control in addition to voltage control. The apparatus 20 for driving semiconductor optical amplifier device adjusts the shape of hysteresis of semiconductor optical amplifier device 1 to optimize the input-output characteristic, in order to attain stochastic resonance effect for desired high-frequency signals.

Stochastic resonance control circuit 26 monitors the state of output light Pout through photo-electric converting element 33. Stochastic resonance control circuit 26 outputs a control signal for adjusting input-output characteristic of semiconductor optical amplifier device 1 to current supplying unit 27.

Current supplying unit 27 injects a current including additional noise current In, to semiconductor optical amplifier device 1 through p-electrodes 37 and 39, in accordance with the control signal from stochastic resonance control circuit 26. Additional noise current In is a current with the noise adjusted to obtain an output light Pout having its amplitude magnified by the stochastic resonance effect and bit error rate reduced.

As described above, according to the apparatus 20 for driving semiconductor optical amplifier device of Embodiment 2, semiconductor optical amplifier device 1 can be operated with the input-output characteristic of optimal hysteresis shape, for amplifying and waveform-shaping the input light Pin with stochastic resonance. The output light Pout amplified by semiconductor optical amplifier device 1 is detected by photo-electric converting element 33. Because of this arrangement, the semiconductor optical amplification module 21 of the apparatus 20 for driving semiconductor optical amplifier device also functions as a receiver that can detect a signal that is too weak to be detected by a common receiver.

The arrangement of p-electrodes 37 to 39 and n-electrode 41 such as shown in FIG. 13 is only an example, and p-electrode 37 to 39 and n-electrode 41 may be divided in any manner provided that currents can be injected independently to optical amplification regions 34, 36 and saturable absorption region 35. Further, as long as the output light Pout can be emitted under the control through p-electrodes 37 to 38 and input light Pin, output light Pout may be emitted not only from the optical amplification region 36 but also from optical amplification region 34 or saturable absorption region 35.

When the volume ratio of saturable absorption region 35 attains 50% or higher than the active layer 43 as a whole, power consumption of semiconductor optical amplifier device 1 increases. Therefore, the volume ratio of saturable absorption region 35 to active layer 43 should preferably be at most 50%.

As described above, in the apparatus 20 for driving semiconductor optical amplifier device of Embodiment 2, the input-output characteristic of semiconductor optical amplifier device 1 is adjusted by applying a voltage to saturable absorption region 35, controlling device temperature, controlling current to be injected to optical amplification regions 34 and 36, and controlling resistance value of variable resistance 25 connected to p-electrode 38 provided corresponding to saturable absorption region 35.

Specifically, in the apparatus 20 for driving semiconductor optical amplifier device, the hysteresis shape is controlled accurately at high speed by using voltage control circuit 28, temperature control circuit 23, variable resistance control circuit 24 and stochastic resonance control circuit 26, whereby operation conditions of semiconductor optical amplifier device 1 can be adjusted precisely. Accordingly, the apparatus 20 for driving semiconductor optical amplifier device can drive the semiconductor optical amplifier device 1 optimized to attain waveform converting effect and stochastic resonance effect, as well as a semiconductor optical amplification module 21 including the device.

In Embodiment 2, part of the reception signal Sr from photo-electric converting element 33 is output as reception current Ir1 to feedback control circuit 22. Therefore, in the apparatus 20 for driving semiconductor optical amplifier device of Embodiment 2, it is possible to change and stabilize the input-output characteristic of semiconductor optical amplifier device 1 while monitoring the state of output light Pout of semiconductor optical amplifier device 1. Therefore, it becomes easier to adjust the output light Pout so that the optical output of semiconductor optical amplifier device 1 comes to have the optimal hysteresis shape that can attain the stochastic resonance effect and desired wavelength.

Further, in the apparatus 20 for driving semiconductor optical amplifier device, control circuits including feedback control circuit 22, temperature control circuit 23, variable resistance control circuit 24, stochastic resonance control circuit 26 and voltage control circuit 28 may be integrated internally as a module, rather than connecting the circuits to the outside of semiconductor optical amplification module 21. In that case, it becomes unnecessary for the user to individually adjust the control circuits one by one, and hence, use of the apparatus 20 for driving semiconductor optical amplifier device would be more convenient.

Further, though the temperature of semiconductor optical amplification module 21 as a whole is adjusted by temperature control mechanism 30 in Embodiment 2, only the temperature of semiconductor optical amplifier device 1 may be adjusted. It is advantageous, however, to adjust the temperature of semiconductor optical amplification module 21 as a whole, as the structure is integrated and compact, and collective temperature control is possible.

Further, in the apparatus 20 for driving semiconductor optical amplifier device, though calculation of optimal parameters becomes somewhat complicated as temperature, resistance value, voltage and intensity of noise current are adjusted, the apparatus is advantageous as the hysteresis of input-output characteristic of semiconductor optical amplifier device 1 can be controlled to the optimal shape with high accuracy. Further, it is also advantageous in that rising threshold value of hysteresis can be increased/decreased delicately to enable driving with low current and that amplitude of output light Pout can more precisely be adjusted.

As described above, according to Embodiment 2, the hysteresis shape of input-output characteristic of semiconductor optical amplifier device 1 can be controlled accurately through temperature, resistance value, current and voltage and, therefore, degradation of output light Pout can be compensated for, utilizing stochastic resonance effect. Thus, input-output characteristic of bistable semiconductor laser optimal for optical amplification and waveform shaping can be attained efficiently.

Modification 1 of Embodiment 2

An apparatus 20A for driving semiconductor optical amplifier device in accordance with Embodiment 2, which is a modification of the apparatus 20 for driving semiconductor optical amplifier device, differs from the apparatus 20 for driving semiconductor optical amplifier device shown in FIG. 13 in that additional noise current Ir supplied to semiconductor optical amplifier device 1 is replaced by additional optical noise Pn similar to that of Embodiment 1. Therefore, accumulative descriptions of FIG. 13 are not repeated here.

In apparatus 20A for driving semiconductor optical amplifier device also, the input light Pin is amplified with degradation compensated, whereby output light Pout having reduced bit error rate can be obtained. Here, a light source for generating the optical noise with control current from stochastic resonance control circuit 26 becomes necessary. This approach, however, is advantageous as it becomes easier to control the relation between the hysteresis threshold value and the intensity of input light Pin of semiconductor optical amplifier device 1.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor optical amplifier device having discontinuous input-output characteristic for input light and output light, comprising:
    an active layer including an optical amplification region and a saturable absorption region;
    an electrode of a first polarity injecting a current and/or applying voltage to said active layer; and
    an electrode of a second polarity that corresponds to said electrode of first polarity; wherein
    a first bias voltage is applied to said saturable absorption region such that a rising threshold value of said input-output characteristic lowers at a timing when the input light assumes "1" and a second bias voltage is applied to said saturable absorption region such that a falling threshold value of said input-output characteristic rises at a timing when the input light assumes "0", through said electrodes of first and second polarities.

2. The semiconductor optical amplifier device according to claim 1, wherein
    carriers remaining in said saturable absorption region are drawn out as a reverse bias is applied as said second bias voltage.

3. The semiconductor optical amplifier device according to claim 1, wherein
    an amount of voltage applied to said saturable absorption region is adjusted such that amplitude of the output light increases and bit error rate of a light signal is reduced.

4. The semiconductor optical amplifier device according to claim 1, wherein
    an amount of current injected to said optical amplification region is adjusted such that amplitude of the output light increases and bit error rate of a light signal is reduced.

5. The semiconductor optical amplifier device according to claim 1, wherein
    said input light is generated by adding an optical noise to a light signal of RZ code system.

6. The semiconductor optical amplifier device according to claim 5, wherein
    said optical noise is injected to at least one of said optical amplification region and said saturable absorption region; and
    an amount of said optical noise is adjusted such that amplitude of said output light increases and bit error rate of said light signal is reduced.

7. The semiconductor optical amplifier device according to claim 5, wherein
    difference between maximum and minimum values of said optical noise is at most ¹⁄₁₀ of the amplitude of said light signal.

8. The semiconductor optical amplifier device according to claim 5, wherein
    said optical noise has random intensity.

9. The semiconductor optical amplifier device according to claim 1, wherein
    a noise current is injected to at least one of said optical amplification region and said saturable absorption region through said electrodes of first and second polarities, and an amount of said noise current is adjusted such that amplitude of said output light increases and bit error rate of said light signal is reduced.

10. The semiconductor optical amplifier device according to claim 9, wherein
    difference between maximum and minimum values of said noise current is at most ¹⁄₁₀ of the amplitude of said injected current.

11. The semiconductor optical amplifier device according to claim 9, wherein
    said noise current has random intensity.

12. The semiconductor optical amplifier device according to claim 1, wherein
    said active layer has a quantum well structure.

13. The semiconductor optical amplifier device according to claim 1, wherein
    at least one of said electrodes of first and second polarities is divided such that a current can be injected independently to said optical amplification region and said saturable absorption region.

14. The semiconductor optical amplifier device according to claim 1, wherein
    an impurity is added to at least one of said optical amplification region and said saturable absorption region, and concentration of said impurity is adjusted such that amplitude of said output light increases and bit error rate of said light signal is reduced.

15. The semiconductor optical amplifier device according to claim 1, being a bistable semiconductor laser having an input-output characteristic with hysteresis.

16. The semiconductor optical amplifier device according to claim 1, wherein
    said optical amplification region includes first and second optical amplification regions arranged on opposite sides of said saturable absorption region; and
    said light signal enters from an end surface of one of said first and second optical amplification regions, and said output light is emitted from an end surface of the other one of said first and second optical amplification regions.

17. The semiconductor optical amplifier device according to claim 1, wherein
    ratio of the length occupied by said saturable absorption region in resonator direction is at least 1% and at most 50%.

18. An apparatus for driving a semiconductor optical amplifier device having discontinuous input-output characteristic for input light and output light, comprising:
- a semiconductor optical amplification module including said semiconductor optical amplifier device and a photo-electric converting element detecting said output light and outputting a reception signal; and
- a feedback control circuit receiving said reception signal and outputting a control signal for adjusting input-output characteristic of said semiconductor optical amplifier device; wherein said semiconductor optical amplifier device includes
- an active layer including an optical amplification region and a saturable absorption region,
- an electrode of a first polarity injecting a current and/or applying voltage to said active layer, and
- an electrode of a second polarity that corresponds to said electrode of first polarity; and
- a first bias voltage is applied to said saturable absorption region such that a rising threshold value of said input-output characteristic lowers at a timing when the input light assumes "1" and a second bias voltage is applied to said saturable absorption region such that a falling threshold value of said input-output characteristic rises at a timing when the input light assumes "0", through said electrodes of first and second polarities.

19. The apparatus for driving a semiconductor optical amplifier device according to claim 18, further comprising
a temperature control circuit controlling temperature of said semiconductor optical amplifier device in accordance with a control signal from said feedback control circuit; wherein
said semiconductor optical amplification module further includes a temperature control mechanism receiving a control signal from said temperature control circuit and adjusting temperature of said semiconductor optical amplification module including said semiconductor optical amplifier device.

20. The apparatus for driving a semiconductor optical amplifier device according to claim 19, wherein
said temperature control mechanism has a thermistor detecting temperature of said semiconductor optical amplifier device and outputting the temperature detection signal to said feedback control circuit.

21. The apparatus for driving a semiconductor optical amplifier device according to claim 19, wherein
said temperature control mechanism has a Peltier cooler receiving a control signal from said temperature control circuit and heating or cooling said semiconductor optical amplifier device.

22. The apparatus for driving a semiconductor optical amplifier device according to claim 18, further comprising
a variable resistance connected to said semiconductor optical amplifier device; and
a variable resistance control unit for controlling resistance value of said variable resistance in accordance with a control signal from said feedback control circuit.

23. The apparatus for driving a semiconductor optical amplifier device according to claim 22, wherein
said feedback control circuit monitors a current flowing from the saturable absorption region of said semiconductor optical amplifier device through said variable resistance.

24. The apparatus for driving a semiconductor optical amplifier device according to claim 18, further comprising:
a stochastic resonance control circuit receiving said reception signal and outputting a control signal for supplying a current having a noise added to attain stochastic resonance effect to said semiconductor optical amplifier device; and
a current supplying unit receiving the control signal from said stochastic resonance control circuit for supplying a current for adjusting input-output characteristic of said semiconductor optical amplifier device to said semiconductor optical amplifier device.

25. The apparatus for driving a semiconductor optical amplifier device according to claim 18, further comprising
a light source for supplying light for adjusting input-output characteristic of said semiconductor optical amplifier device to said semiconductor optical amplifier device.

26. The apparatus for driving a semiconductor optical amplifier device according to claim 25, wherein
said light source receives said reception signal and supplies light having noise added to attain stochastic resonance effect to said semiconductor optical amplifier device.

27. The apparatus for driving a semiconductor optical amplifier device according to claim 18, further comprising:
a voltage control circuit controlling a voltage applied to said saturable absorption region of said semiconductor optical amplifier device based on the control signal from said feedback control circuit; and
a voltage supplying unit supplying a voltage adjusted such that said input light goes up/down across rising threshold value and falling threshold value of said semiconductor optical amplifier device, to said semiconductor optical amplifier device, in accordance with a control signal from said voltage control circuit.

28. The apparatus for driving a semiconductor optical amplifier device according to claim 18, further comprising
a current supplying unit for supplying a current adjusted such that said input light goes up/down across rising threshold value and falling threshold value of said semiconductor optical amplifier device, to said semiconductor optical amplifier device, based on said reception signal.

29. The apparatus for driving a semiconductor optical amplifier device according to claim 18, wherein
said photo-electric converting element is integrated on one same substrate as said semiconductor optical amplification module.

* * * * *